United States Patent [19]
Kobayashi

[11] Patent Number: 5,835,428
[45] Date of Patent: Nov. 10, 1998

[54] METHOD OF TESTING SEMICONDUCTOR MEMORY AND APPARATUS FOR CARRYING OUT THE METHOD

[75] Inventor: Shinichi Kobayashi, Kumagaya, Japan

[73] Assignee: Advantest Corporation, Tokyo, Japan

[21] Appl. No.: 793,638

[22] PCT Filed: Jun. 28, 1996

[86] PCT No.: PCT/JP96/01796

§ 371 Date: Jun. 6, 1997

§ 102(e) Date: Jun. 6, 1997

[87] PCT Pub. No.: WO97/02574

PCT Pub. Date: Jan. 23, 1997

[30] Foreign Application Priority Data

Jun. 30, 1995 [JP] Japan ................................ 7-166317

[51] Int. Cl.$^6$ ............................................. G11C 29/00
[52] U.S. Cl. ...................................... 365/201; 371/21.2
[58] Field of Search .......................... 365/201, 185.09; 371/21.2, 10.2, 40.3

[56] References Cited

U.S. PATENT DOCUMENTS

| | | | |
|---|---|---|---|
| 5,278,839 | 1/1994 | Matsumoto et al. | 371/21.2 |
| 5,291,449 | 3/1994 | Dehara | 365/201 |
| 5,539,699 | 7/1996 | Sato et al. | 371/21.2 |
| 5,673,270 | 9/1997 | Tsujimoto | 371/21.2 |

*Primary Examiner*—Tan T. Nguyen
*Attorney, Agent, or Firm*—Staas & Halsey

[57] ABSTRACT

A semiconductor memory testing method and a semiconductor memory testing apparatus which can smoothly read out the stored contents of a failure analysis memory are provided. When writing sequence data generated from a plurality of test pattern generators 2 in a memory 6 under test through a first interleave circuit $7_1$ by means of a first interleave operation, reading out the test results through a second interleave circuit $7_2$ by means of a second interleave operation and distributing them to a plurality of logical comparators 4, comparing the test results with expected value data, and distributing, If the comparison result is failure, data in that interleave cycle containing the failure data to a plurality of failure analysis memories 5 to store the data therein, failure mark signals are generated from the logical comparators 4 based on the failure data, and are also stored in the failure analysis memories 5 in correspondence to the respective failure signals. After the test is finished, the failure mark signals are read out from the failure analysis memories 5 to identify a data cycle in which a failure has occurred.

8 Claims, 17 Drawing Sheets

| PRESCRIBED LS 2BITS | COUNTER LS 2BITS | A | B | NO. OF OVER RUN |
|---|---|---|---|---|
| 00 | 00 | 00 | — | 0 |
|    | 01 | 01 | — | 1 |
|    | 10 | 10 | — | 2 |
|    | 11 | 11 | — | 3 |
| 01 | 00 | 01 | 11 | 3 |
|    | 01 | 10 | 00 | 0 |
|    | 10 | 11 | 01 | 1 |
|    | 11 | 00 | 10 | 2 |
| 10 | 00 | 10 | — | 2 |
|    | 01 | 11 | — | 3 |
|    | 10 | 00 | — | 0 |
|    | 11 | 01 | — | 1 |
| 11 | 00 | 11 | 01 | 1 |
|    | 01 | 00 | 10 | 2 |
|    | 10 | 01 | 11 | 3 |
|    | 11 | 10 | 00 | 0 |

PRESCRIBED VALUE / LS 4BITS

| | | A | B(÷6) | C(÷4) | D(÷2) | Over Run |
|---|---|---|---|---|---|---|
| 000 | 000 | 000 | – | – | – | 000 |
| | 001 | 001 | – | – | – | 001 |
| | 010 | 010 | – | – | – | 010 |
| | 011 | 011 | – | – | – | 011 |
| | 100 | 100 | – | – | – | 100 |
| | 101 | 101 | – | – | – | 101 |
| | 110 | 110 | – | – | – | 110 |
| | 111 | 111 | – | – | – | 111 |
| 001 | 000 | 001 | 111 | – | – | 111 |
| | 001 | 010 | 000 | – | – | 000 |
| | 010 | 011 | 001 | – | – | 001 |
| | 011 | 100 | 010 | – | – | 010 |
| | 100 | 101 | 011 | – | – | 011 |
| | 101 | 110 | 100 | – | – | 100 |
| | 110 | 111 | 101 | – | – | 101 |
| | 111 | 000 | 110 | – | – | 110 |
| 010 | 000 | 010 | – | 110 | – | 110 |
| | 001 | 011 | – | 111 | – | 111 |
| | 010 | 100 | – | 000 | – | 000 |
| | 011 | 101 | – | 001 | – | 001 |
| | 100 | 110 | – | 010 | – | 010 |
| | 101 | 111 | – | 011 | – | 011 |
| | 110 | 000 | – | 100 | – | 100 |
| | 111 | 001 | – | 101 | – | 101 |
| 011 | 000 | 011 | – | – | 101 | 101 |
| | 001 | 100 | – | – | 110 | 110 |
| | 010 | 101 | – | – | 111 | 111 |
| | 011 | 110 | – | – | 000 | 000 |
| | 100 | 111 | – | – | 001 | 001 |
| | 101 | 000 | – | – | 010 | 010 |
| | 110 | 001 | – | – | 011 | 011 |
| | 111 | 010 | – | – | 100 | 100 |
| 100 | 000 | 100 | – | – | – | 100 |
| | 001 | 101 | – | – | – | 101 |
| | 010 | 110 | – | – | – | 110 |
| | 011 | 111 | – | – | – | 111 |
| | 100 | 000 | – | – | – | 000 |
| | 101 | 001 | – | – | – | 001 |
| | 110 | 010 | – | – | – | 010 |
| | 111 | 011 | – | – | – | 011 |
| 101 | 000 | 101 | 011 | – | – | 011 |
| | 001 | 110 | 100 | – | – | 100 |
| | 010 | 111 | 101 | – | – | 101 |
| | 011 | 000 | 110 | – | – | 110 |
| | 100 | 001 | 111 | – | – | 111 |
| | 101 | 010 | 000 | – | – | 000 |
| | 110 | 011 | 001 | – | – | 001 |
| | 111 | 100 | 010 | – | – | 010 |
| 110 | 000 | 110 | – | 010 | – | 010 |
| | 001 | 111 | – | 011 | – | 011 |
| | 010 | 000 | – | 100 | – | 100 |
| | 011 | 001 | – | 101 | – | 101 |
| | 100 | 010 | – | 110 | – | 110 |
| | 101 | 011 | – | 111 | – | 111 |
| | 110 | 100 | – | 000 | – | 000 |
| | 111 | 101 | – | 001 | – | 001 |
| 111 | 000 | 111 | – | – | 001 | 001 |
| | 001 | 000 | – | – | 010 | 010 |
| | 010 | 001 | – | – | 011 | 011 |
| | 011 | 010 | – | – | 100 | 100 |
| | 100 | 011 | – | – | 101 | 101 |
| | 101 | 100 | – | – | 110 | 110 |
| | 110 | 101 | – | – | 111 | 111 |
| | 111 | 110 | – | – | 000 | 000 |

FIG. 8

PRESCRIBED VALUE / LS 4BITS

| | | A | B(+#E) | C(+#C) | D(+#A) | E(+#8) | F(+#6) | G(+#4) | H(+#2) | Over Run |
|---|---|---|---|---|---|---|---|---|---|---|
| 0000 | 0000 | 0000 | – | – | – | – | – | – | – | 0000 |
| | 0001 | 0001 | – | – | – | – | – | – | – | 0001 |
| | 0010 | 0010 | – | – | – | – | – | – | – | 0010 |
| | 0011 | 0011 | – | – | – | – | – | – | – | 0011 |
| | 0100 | 0100 | – | – | – | – | – | – | – | 0100 |
| | 0101 | 0101 | – | – | – | – | – | – | – | 0101 |
| | 0110 | 0110 | – | – | – | – | – | – | – | 0110 |
| | 0111 | 0111 | – | – | – | – | – | – | – | 0111 |
| | 1000 | 1000 | – | – | – | – | – | – | – | 1000 |
| | 1001 | 1001 | – | – | – | – | – | – | – | 1001 |
| | 1010 | 1010 | – | – | – | – | – | – | – | 1010 |
| | 1011 | 1011 | – | – | – | – | – | – | – | 1011 |
| | 1100 | 1100 | – | – | – | – | – | – | – | 1100 |
| | 1101 | 1101 | – | – | – | – | – | – | – | 1101 |
| | 1110 | 1110 | – | – | – | – | – | – | – | 1110 |
| | 1111 | 1111 | – | – | – | – | – | – | – | 1111 |
| 0001 | 0000 | 0001 | 1111 | – | – | – | – | – | – | 1111 |
| | 0001 | 0010 | 0000 | – | – | – | – | – | – | 0000 |
| | 0010 | 0011 | 0001 | – | – | – | – | – | – | 0001 |
| | 0011 | 0100 | 0010 | – | – | – | – | – | – | 0010 |
| | 0100 | 0101 | 0011 | – | – | – | – | – | – | 0011 |
| | 0101 | 0110 | 0100 | – | – | – | – | – | – | 0100 |
| | 0110 | 0111 | 0101 | – | – | – | – | – | – | 0101 |
| | 0111 | 1000 | 0110 | – | – | – | – | – | – | 0110 |
| | 1000 | 1001 | 0111 | – | – | – | – | – | – | 0111 |
| | 1001 | 1010 | 1000 | – | – | – | – | – | – | 1000 |
| | 1010 | 1011 | 1001 | – | – | – | – | – | – | 1001 |
| | 1011 | 1100 | 1010 | – | – | – | – | – | – | 1010 |
| | 1100 | 1101 | 1011 | – | – | – | – | – | – | 1011 |
| | 1101 | 1110 | 1100 | – | – | – | – | – | – | 1100 |
| | 1110 | 1111 | 1101 | – | – | – | – | – | – | 1101 |
| | 1111 | 0000 | 1110 | – | – | – | – | – | – | 1110 |
| 0010 | 0000 | 0010 | – | 1110 | – | – | – | – | – | 1110 |
| | 0001 | 0011 | – | 1111 | – | – | – | – | – | 1111 |
| | 0010 | 0100 | – | 0000 | – | – | – | – | – | 0000 |
| | 0011 | 0101 | – | 0001 | – | – | – | – | – | 0001 |
| | 0100 | 0110 | – | 0010 | – | – | – | – | – | 0010 |
| | 0101 | 0111 | – | 0011 | – | – | – | – | – | 0011 |
| | 0110 | 1000 | – | 0100 | – | – | – | – | – | 0100 |
| | 0111 | 1001 | – | 0101 | – | – | – | – | – | 0101 |
| | 1000 | 1010 | – | 0110 | – | – | – | – | – | 0110 |
| | 1001 | 1011 | – | 0111 | – | – | – | – | – | 0111 |
| | 1010 | 1100 | – | 1000 | – | – | – | – | – | 1000 |
| | 1011 | 1101 | – | 1001 | – | – | – | – | – | 1001 |
| | 1100 | 1110 | – | 1010 | – | – | – | – | – | 1010 |
| | 1101 | 1111 | – | 1011 | – | – | – | – | – | 1011 |
| | 1110 | 0000 | – | 1100 | – | – | – | – | – | 1100 |
| | 1111 | 0001 | – | 1101 | – | – | – | – | – | 1101 |
| 0011 | 0000 | 0011 | – | – | 1101 | – | – | – | – | 1101 |
| | 0001 | 0100 | – | – | 1110 | – | – | – | – | 1110 |
| | 0010 | 0101 | – | – | 1111 | – | – | – | – | 1111 |
| | 0011 | 0110 | – | – | 0000 | – | – | – | – | 0000 |
| | 0100 | 0111 | – | – | 0001 | – | – | – | – | 0001 |
| | 0101 | 1000 | – | – | 0010 | – | – | – | – | 0010 |
| | 0110 | 1001 | – | – | 0011 | – | – | – | – | 0011 |
| | 0111 | 1010 | – | – | 0100 | – | – | – | – | 0100 |
| | 1000 | 1011 | – | – | 0101 | – | – | – | – | 0101 |
| | 1001 | 1100 | – | – | 0110 | – | – | – | – | 0110 |
| | 1010 | 1101 | – | – | 0111 | – | – | – | – | 0111 |
| | 1011 | 1110 | – | – | 1000 | – | – | – | – | 1000 |
| | 1100 | 1111 | – | – | 1001 | – | – | – | – | 1001 |
| | 1101 | 0000 | – | – | 1010 | – | – | – | – | 1010 |
| | 1110 | 0001 | – | – | 1011 | – | – | – | – | 1011 |
| | 1111 | 0010 | – | – | 1100 | – | – | – | – | 1100 |

FIG. 9

PRESCRIBED VALUE / LS 4BITS

| | | A | B(+#E) | C(+#C) | D(+#A) | E(+#8) | F(+#6) | G(+#4) | H(+#2) | Over Run |
|---|---|---|---|---|---|---|---|---|---|---|
| 0100 | 0000 | 0100 | – | – | – | 1100 | – | – | – | 1100 |
| | 0001 | 0101 | – | – | – | 1101 | – | – | – | 1101 |
| | 0010 | 0110 | – | – | – | 1110 | – | – | – | 1110 |
| | 0011 | 0111 | – | – | – | 1111 | – | – | – | 1111 |
| | 0100 | 1000 | – | – | – | 0000 | – | – | – | 0000 |
| | 0101 | 1001 | – | – | – | 0001 | – | – | – | 0001 |
| | 0110 | 1010 | – | – | – | 0010 | – | – | – | 0010 |
| | 0111 | 1011 | – | – | – | 0011 | – | – | – | 0011 |
| | 1000 | 1100 | – | – | – | 0100 | – | – | – | 0100 |
| | 1001 | 1101 | – | – | – | 0101 | – | – | – | 0101 |
| | 1010 | 1110 | – | – | – | 0110 | – | – | – | 0110 |
| | 1011 | 1111 | – | – | – | 0111 | – | – | – | 0111 |
| | 1100 | 0000 | – | – | – | 1000 | – | – | – | 1000 |
| | 1101 | 0001 | – | – | – | 1001 | – | – | – | 1001 |
| | 1110 | 0010 | – | – | – | 1010 | – | – | – | 1010 |
| | 1111 | 0011 | – | – | – | 1011 | – | – | – | 1011 |
| 0101 | 0000 | 0101 | – | – | – | – | 1011 | – | – | 1011 |
| | 0001 | 0110 | – | – | – | – | 1100 | – | – | 1100 |
| | 0010 | 0111 | – | – | – | – | 1101 | – | – | 1101 |
| | 0011 | 1000 | – | – | – | – | 1110 | – | – | 1110 |
| | 0100 | 1001 | – | – | – | – | 1111 | – | – | 1111 |
| | 0101 | 1010 | – | – | – | – | 0000 | – | – | 0000 |
| | 0110 | 1011 | – | – | – | – | 0001 | – | – | 0001 |
| | 0111 | 1100 | – | – | – | – | 0010 | – | – | 0010 |
| | 1000 | 1101 | – | – | – | – | 0011 | – | – | 0011 |
| | 1001 | 1110 | – | – | – | – | 0100 | – | – | 0100 |
| | 1010 | 1111 | – | – | – | – | 0101 | – | – | 0101 |
| | 1011 | 0000 | – | – | – | – | 0110 | – | – | 0110 |
| | 1100 | 0001 | – | – | – | – | 0111 | – | – | 0111 |
| | 1101 | 0010 | – | – | – | – | 1000 | – | – | 1000 |
| | 1110 | 0011 | – | – | – | – | 1001 | – | – | 1001 |
| | 1111 | 0100 | – | – | – | – | 1010 | – | – | 1010 |
| 0110 | 0000 | 0110 | – | – | – | – | – | 1010 | – | 1010 |
| | 0001 | 0111 | – | – | – | – | – | 1011 | – | 1011 |
| | 0010 | 1000 | – | – | – | – | – | 1100 | – | 1100 |
| | 0011 | 1001 | – | – | – | – | – | 1101 | – | 1101 |
| | 0100 | 1010 | – | – | – | – | – | 1110 | – | 1110 |
| | 0101 | 1011 | – | – | – | – | – | 1111 | – | 1111 |
| | 0110 | 1100 | – | – | – | – | – | 0000 | – | 0000 |
| | 0111 | 1101 | – | – | – | – | – | 0001 | – | 0001 |
| | 1000 | 1110 | – | – | – | – | – | 0010 | – | 0010 |
| | 1001 | 1111 | – | – | – | – | – | 0011 | – | 0011 |
| | 1010 | 0000 | – | – | – | – | – | 0100 | – | 0100 |
| | 1011 | 0001 | – | – | – | – | – | 0101 | – | 0101 |
| | 1100 | 0010 | – | – | – | – | – | 0110 | – | 0110 |
| | 1101 | 0011 | – | – | – | – | – | 0111 | – | 0111 |
| | 1110 | 0100 | – | – | – | – | – | 1000 | – | 1000 |
| | 1111 | 0101 | – | – | – | – | – | 1001 | – | 1001 |
| 0111 | 0000 | 0111 | – | – | – | – | – | – | 1001 | 1001 |
| | 0001 | 1000 | – | – | – | – | – | – | 1010 | 1010 |
| | 0010 | 1001 | – | – | – | – | – | – | 1011 | 1011 |
| | 0011 | 1010 | – | – | – | – | – | – | 1100 | 1100 |
| | 0100 | 1011 | – | – | – | – | – | – | 1101 | 1101 |
| | 0101 | 1100 | – | – | – | – | – | – | 1110 | 1110 |
| | 0110 | 1101 | – | – | – | – | – | – | 1111 | 1111 |
| | 0111 | 1110 | – | – | – | – | – | – | 0000 | 0000 |
| | 1000 | 1111 | – | – | – | – | – | – | 0001 | 0001 |
| | 1001 | 0000 | – | – | – | – | – | – | 0010 | 0010 |
| | 1010 | 0001 | – | – | – | – | – | – | 0011 | 0011 |
| | 1011 | 0010 | – | – | – | – | – | – | 0100 | 0100 |
| | 1100 | 0011 | – | – | – | – | – | – | 0101 | 0101 |
| | 1101 | 0100 | – | – | – | – | – | – | 0110 | 0110 |
| | 1110 | 0101 | – | – | – | – | – | – | 0111 | 0111 |
| | 1111 | 0110 | – | – | – | – | – | – | 1000 | 1000 |

FIG. 10

PRESCRIBED VALUE / LS 4BITS

| | | A | B(+#E) | C(+#C) | D(+#A) | E(+#8) | F(+#6) | G(+#4) | H(+#2) | Over Run |
|---|---|---|---|---|---|---|---|---|---|---|
| 1000 | 0000 | 1000 | – | – | – | – | – | – | – | 1000 |
| | 0001 | 1001 | – | – | – | – | – | – | – | 1001 |
| | 0010 | 1010 | – | – | – | – | – | – | – | 1010 |
| | 0011 | 1011 | – | – | – | – | – | – | – | 1011 |
| | 0100 | 1100 | – | – | – | – | – | – | – | 1100 |
| | 0101 | 1101 | – | – | – | – | – | – | – | 1101 |
| | 0110 | 1110 | – | – | – | – | – | – | – | 1110 |
| | 0111 | 1111 | – | – | – | – | – | – | – | 1111 |
| | 1000 | 0000 | – | – | – | – | – | – | – | 0000 |
| | 1001 | 0001 | – | – | – | – | – | – | – | 0001 |
| | 1010 | 0010 | – | – | – | – | – | – | – | 0010 |
| | 1011 | 0011 | – | – | – | – | – | – | – | 0011 |
| | 1100 | 0100 | – | – | – | – | – | – | – | 0100 |
| | 1101 | 0101 | – | – | – | – | – | – | – | 0101 |
| | 1110 | 0110 | – | – | – | – | – | – | – | 0110 |
| | 1111 | 0111 | – | – | – | – | – | – | – | 0111 |
| 1001 | 0000 | 1001 | 0111 | – | – | – | – | – | – | 0111 |
| | 0001 | 1010 | 1000 | – | – | – | – | – | – | 1000 |
| | 0010 | 1011 | 1001 | – | – | – | – | – | – | 1001 |
| | 0011 | 1100 | 1010 | – | – | – | – | – | – | 1010 |
| | 0100 | 1101 | 1011 | – | – | – | – | – | – | 1011 |
| | 0101 | 1110 | 1100 | – | – | – | – | – | – | 1100 |
| | 0110 | 1111 | 1101 | – | – | – | – | – | – | 1101 |
| | 0111 | 0000 | 1110 | – | – | – | – | – | – | 1110 |
| | 1000 | 0001 | 1111 | – | – | – | – | – | – | 1111 |
| | 1001 | 0010 | 0000 | – | – | – | – | – | – | 0000 |
| | 1010 | 0011 | 0001 | – | – | – | – | – | – | 0001 |
| | 1011 | 0100 | 0010 | – | – | – | – | – | – | 0010 |
| | 1100 | 0101 | 0011 | – | – | – | – | – | – | 0011 |
| | 1101 | 0110 | 0100 | – | – | – | – | – | – | 0100 |
| | 1110 | 0111 | 0101 | – | – | – | – | – | – | 0101 |
| | 1111 | 1000 | 0110 | – | – | – | – | – | – | 0110 |
| 1010 | 0000 | 1010 | – | 0110 | – | – | – | – | – | 0110 |
| | 0001 | 1011 | – | 0111 | – | – | – | – | – | 0111 |
| | 0010 | 1100 | – | 1000 | – | – | – | – | – | 1000 |
| | 0011 | 1101 | – | 1001 | – | – | – | – | – | 1001 |
| | 0100 | 1110 | – | 1010 | – | – | – | – | – | 1010 |
| | 0101 | 1111 | – | 1011 | – | – | – | – | – | 1011 |
| | 0110 | 0000 | – | 1100 | – | – | – | – | – | 1100 |
| | 0111 | 0001 | – | 1101 | – | – | – | – | – | 1101 |
| | 1000 | 0010 | – | 1110 | – | – | – | – | – | 1110 |
| | 1001 | 0011 | – | 1111 | – | – | – | – | – | 1111 |
| | 1010 | 0100 | – | 0000 | – | – | – | – | – | 0000 |
| | 1011 | 0101 | – | 0001 | – | – | – | – | – | 0001 |
| | 1100 | 0110 | – | 0010 | – | – | – | – | – | 0010 |
| | 1101 | 0111 | – | 0011 | – | – | – | – | – | 0011 |
| | 1110 | 1000 | – | 0100 | – | – | – | – | – | 0100 |
| | 1111 | 1001 | – | 0101 | – | – | – | – | – | 0101 |
| 1011 | 0000 | 1011 | – | – | 0101 | – | – | – | – | 0101 |
| | 0001 | 1100 | – | – | 0110 | – | – | – | – | 0110 |
| | 0010 | 1101 | – | – | 0111 | – | – | – | – | 0111 |
| | 0011 | 1110 | – | – | 1000 | – | – | – | – | 1000 |
| | 0100 | 1111 | – | – | 1001 | – | – | – | – | 1001 |
| | 0101 | 0000 | – | – | 1010 | – | – | – | – | 1010 |
| | 0110 | 0001 | – | – | 1011 | – | – | – | – | 1011 |
| | 0111 | 0010 | – | – | 1100 | – | – | – | – | 1100 |
| | 1000 | 0011 | – | – | 1101 | – | – | – | – | 1101 |
| | 1001 | 0100 | – | – | 1110 | – | – | – | – | 1110 |
| | 1010 | 0101 | – | – | 1111 | – | – | – | – | 1111 |
| | 1011 | 0110 | – | – | 0000 | – | – | – | – | 0000 |
| | 1100 | 0111 | – | – | 0001 | – | – | – | – | 0001 |
| | 1101 | 1000 | – | – | 0010 | – | – | – | – | 0010 |
| | 1110 | 1001 | – | – | 0011 | – | – | – | – | 0011 |
| | 1111 | 1010 | – | – | 0100 | – | – | – | – | 0100 |

FIG. 11

| PRESCRIBED VALUE | LS 4BITS | A | B(+#E) | C(+#C) | D(+#A) | E(+#8) | F(+#6) | G(+#4) | H(+#2) | Over Run |
|---|---|---|---|---|---|---|---|---|---|---|
| 0100 | 0000 | 1100 | − | − | − | 0100 | − | − | − | 0100 |
|  | 0001 | 1101 | − | − | − | 0101 | − | − | − | 0101 |
|  | 0010 | 1110 | − | − | − | 0110 | − | − | − | 0110 |
|  | 0011 | 1111 | − | − | − | 0111 | − | − | − | 0111 |
|  | 0100 | 0000 | − | − | − | 1000 | − | − | − | 1000 |
|  | 0101 | 0001 | − | − | − | 1001 | − | − | − | 1001 |
|  | 0110 | 0010 | − | − | − | 1010 | − | − | − | 1010 |
|  | 0111 | 0011 | − | − | − | 1011 | − | − | − | 1011 |
|  | 1000 | 0100 | − | − | − | 1100 | − | − | − | 1100 |
|  | 1001 | 0101 | − | − | − | 1101 | − | − | − | 1101 |
|  | 1010 | 0110 | − | − | − | 1110 | − | − | − | 1110 |
|  | 1011 | 0111 | − | − | − | 1111 | − | − | − | 1111 |
|  | 1100 | 1000 | − | − | − | 0000 | − | − | − | 0000 |
|  | 1101 | 1001 | − | − | − | 0001 | − | − | − | 0001 |
|  | 1110 | 1010 | − | − | − | 0010 | − | − | − | 0010 |
|  | 1111 | 1011 | − | − | − | 0011 | − | − | − | 0011 |
| 1101 | 0000 | 1101 | − | − | − | − | 0011 | − | − | 0011 |
|  | 0001 | 1110 | − | − | − | − | 0100 | − | − | 0100 |
|  | 0010 | 1111 | − | − | − | − | 0101 | − | − | 0101 |
|  | 0011 | 0000 | − | − | − | − | 0110 | − | − | 0110 |
|  | 0100 | 0001 | − | − | − | − | 0111 | − | − | 0111 |
|  | 0101 | 0010 | − | − | − | − | 1000 | − | − | 1000 |
|  | 0110 | 0011 | − | − | − | − | 1001 | − | − | 1001 |
|  | 0111 | 0100 | − | − | − | − | 1010 | − | − | 1010 |
|  | 1000 | 0101 | − | − | − | − | 1011 | − | − | 1011 |
|  | 1001 | 0110 | − | − | − | − | 1100 | − | − | 1100 |
|  | 1010 | 0111 | − | − | − | − | 1101 | − | − | 1101 |
|  | 1011 | 1000 | − | − | − | − | 1110 | − | − | 1110 |
|  | 1100 | 1001 | − | − | − | − | 1111 | − | − | 1111 |
|  | 1101 | 1010 | − | − | − | − | 0000 | − | − | 0000 |
|  | 1110 | 1011 | − | − | − | − | 0001 | − | − | 0001 |
|  | 1111 | 1100 | − | − | − | − | 0010 | − | − | 0010 |
| 1110 | 0000 | 1110 | − | − | − | − | − | 0010 | − | 0010 |
|  | 0001 | 1111 | − | − | − | − | − | 0011 | − | 0011 |
|  | 0010 | 0000 | − | − | − | − | − | 0100 | − | 0100 |
|  | 0011 | 0001 | − | − | − | − | − | 0101 | − | 0101 |
|  | 0100 | 0010 | − | − | − | − | − | 0110 | − | 0110 |
|  | 0101 | 0011 | − | − | − | − | − | 0111 | − | 0111 |
|  | 0110 | 0100 | − | − | − | − | − | 1000 | − | 1000 |
|  | 0111 | 0101 | − | − | − | − | − | 1001 | − | 1001 |
|  | 1000 | 0110 | − | − | − | − | − | 1010 | − | 1010 |
|  | 1001 | 0111 | − | − | − | − | − | 1011 | − | 1011 |
|  | 1010 | 1000 | − | − | − | − | − | 1100 | − | 1100 |
|  | 1011 | 1001 | − | − | − | − | − | 1101 | − | 1101 |
|  | 1100 | 1010 | − | − | − | − | − | 1110 | − | 1110 |
|  | 1101 | 1011 | − | − | − | − | − | 1111 | − | 1111 |
|  | 1110 | 1100 | − | − | − | − | − | 0000 | − | 0000 |
|  | 1111 | 1101 | − | − | − | − | − | 0001 | − | 0001 |
| 1111 | 0000 | 1111 | − | − | − | − | − | − | 0001 | 0001 |
|  | 0001 | 0000 | − | − | − | − | − | − | 0010 | 0010 |
|  | 0010 | 0001 | − | − | − | − | − | − | 0011 | 0011 |
|  | 0011 | 0010 | − | − | − | − | − | − | 0100 | 0100 |
|  | 0100 | 0011 | − | − | − | − | − | − | 0101 | 0101 |
|  | 0101 | 0100 | − | − | − | − | − | − | 0110 | 0110 |
|  | 0110 | 0101 | − | − | − | − | − | − | 0111 | 0111 |
|  | 0111 | 0110 | − | − | − | − | − | − | 1000 | 1000 |
|  | 1000 | 0111 | − | − | − | − | − | − | 1001 | 1001 |
|  | 1001 | 1000 | − | − | − | − | − | − | 1010 | 1010 |
|  | 1010 | 1001 | − | − | − | − | − | − | 1011 | 1011 |
|  | 1011 | 1010 | − | − | − | − | − | − | 1100 | 1100 |
|  | 1100 | 1011 | − | − | − | − | − | − | 1101 | 1101 |
|  | 1101 | 1100 | − | − | − | − | − | − | 1110 | 1110 |
|  | 1110 | 1101 | − | − | − | − | − | − | 1111 | 1111 |
|  | 1111 | 1110 | − | − | − | − | − | − | 0000 | 0000 |

METHOD OF TESTING SEMICONDUCTOR MEMORY AND APPARATUS FOR CARRYING OUT THE METHOD

TECHNICAL FIELD

The present invention relates to a method of testing a semiconductor memory such as a RAM (random access memory), a ROM (read only memory), a charge transfer device (CCD) memory or the like and to an apparatus for carrying out the method. Particularly, the present invention relates to a method of testing a semiconductor memory by which a failure history of the tested memory can be smoothly read from a failure analysis memory, and to an apparatus for carrying out the method, the failure history being the stored contents of a failure analysis memory which stores the test results (the results of pass/failure decision) of a semiconductor memory.

BACKGROUND ART

First, a basic arrangement of a conventional semiconductor memory testing apparatus of this type will briefly be explained with reference to FIG. 12. The illustrated semiconductor memory testing apparatus comprises a timing generator 1, a test pattern generator 2, a waveform shaping device 3, a logical comparator 4 and a failure analysis memory 5, and carries out a testing of a semiconductor memory 6 to be tested. The test pattern generator 2, in response to a reference clock (REF CLK) CK supplied from the timing generator 1, generates an address signal ADS, a test data signal PD and a control signal (CONT SIG) CS to be supplied to the memory 6 under test (MUT) as well as generates an expected value (EXP) data signal ED to be supplied to the logical comparator 4 and the failure analysis memory 5. These signals (data) ADS, PD and CS are inputted to the waveform shaping device 3 where the signals are shaped in waveform to be required for the testing of the memory 6 under test, and then are applied to the memory 6.

The memory 6 under test is controlled in writing or reading of a test data signal thereto or therefrom by application of a control signal CS thereto. That is, a test data signal is sequentially written to the address of the memory 6 under test specified by an address signal ADS by applying a control signal CS for writing to the memory 6. On the contrary, a test data signal written in the memory 6 under test is sequentially read out from the address thereof specified by an address signal ADS by applying a control signal CS for reading to the memory 6. A read out data signal RD read from the memory 6 under test is supplied to the logical comparator 4 in which the read out data signal RD is compared with an expected value data signal ED outputted from the test pattern generator 2. Then, a decision of pass or failure for the memory 6 under test (PASS/FAIL DECISION) is rendered based on the comparison result, i.e., on the basis that the read out data signal is conformable or unconformable to the expected value data signal.

The failure analysis memory 5 used in the semiconductor memory testing apparatus stores a sequence data which is outputs of the test pattern generator 2 in a cycle in which the result of a pass/failure decision for a memory under test is failure. That is, the failure analysis memory 5 stores an address signal ADS, a test data signal PD, an expected value data signal ED and failure information indicating a state of a data output pin or pins of the memory 6 under test which is decided to be a failure. After the test is completed, a failure analysis of the memory 6 under test is performed by reading and analyzing the stored contents of the failure analysis memory 5.

In the conventional semiconductor memory testing apparatus mentioned above, an address signal ADS, a test data signal PD and a control signal CS generated by one-test pattern generator 2 are applied to a memory 6 under test and failure data of the memory 6 is stored in corresponding one failure analysis memory 5. Therefore, when the sequence data and the failure information in a cycle in which the result of a pass/failure decision for a memory 6 under test is failure are stored in the failure analysis memory 5, the only data in the cycle in which the result of a pass/failure decision for the memory 6 is failure may be stored in the failure analysis memory 5. When the stored contents of the failure analysis memory 5 are read out for a failure analysis, the data can be read out in the sequence of the failure occurrences by reading the stored contents of the failure analysis memory sequentially from the initial address of the failure analysis memory 5.

In a testing of a semiconductor memory, there are often the cases that a method of using the failure analysis memory 5 wherein the number of failures of a memory 6 under test is counted and the failure data are stored in the failure analysis memory 5 until the count of failures reaches a prescribed or predetermined value, and the further storage of the failure data is stopped when the count of failures reaches the prescribed value. An example of a basic arrangement of a semiconductor memory testing apparatus used in this case will briefly be described with reference to FIG. 13.

As shown in FIG. 13, in a semiconductor memory testing apparatus having a construction shown in FIG. 12, there are added to the output side of the logical comparator 4 a counter 7 for counting the total number (an output of an OR circuit) of failures of data output pins of the memory 6 under test, a register 8 in which a prescribed value of the number of failures is previously stored, a comparator circuit 9 for comparing the prescribed value of the number of failures with a count value of the counter 7, and a memory control circuit 10 for controlling a writing of failure data into the failure analysis memory 5. When the count value of the counter 7 becomes greater than the prescribed value of the number of failures, the comparator circuit 9 outputs a write inhibition (WRITE INHIBIT) signal to the memory control circuit 10 which in turn controls to inhibit the failure data from being written into the failure analysis memory 5 after the write inhibition signal has been outputted.

In order to test a high-speed semiconductor memory using a semiconductor memory testing apparatus having the construction as mentioned above, it is necessary to operate the test pattern generator 2 at high speed to generate the address signals ADS, the test data signals PD and the control signals CS at high speed. However, as a matter of course, there is a limitation in operating the pattern generator 2 at high speed. Therefore, in the aforementioned semiconductor memory testing apparatus, the operation speed of the test pattern generator 2 limits the testing speed of the whole apparatus so that a high-speed semiconductor memory having an operation speed higher than the operation speed of the test pattern generator 2 cannot be tested by the aforementioned semiconductor memory testing apparatus. Consequently, in a test of a high-speed semiconductor memory, a semiconductor memory testing apparatus having a plurality of test pattern generators 2 provided therein is used, which are operated in the manner of an interleave operation so that test patterns can be generated therefrom at high speed.

Now an example of a basic construction of a semiconductor memory testing apparatus for performing an interleave operation will briefly be described with reference to FIG. 14. As shown in FIG. 14, there are provided a timing generator generally indicated by reference numeral 1 comprising a plurality of n timing generators 1, 2, 3, . . . n (n is an integer equal to or greater than 2), a test pattern generator generally indicated by reference numeral 2 comprising a plurality of n test pattern generators 1, 2, 3, . . . n, a waveform shaping device generally indicated by reference numeral 3 comprising a plurality of n waveform shaping devices 1, 2, 3, . . . n, a logical comparator generally indicated by reference numeral 4 comprising a plurality of n logical comparators 1, 2, 3, . . . n, and a failure analysis memory generally indicated by reference numeral 5 comprising a plurality of n failure analysis memories 1, 2, 3, . . . n. In addition, a first interleave circuit $7_1$ and a second Interleave circuit $7_2$ are provided at the input side and the output side of the memory 6 under test, respectively. Output data signals IN1, IN2, IN3, . . . INn of the respective n waveform shaping devices 1, 2, . . . n, are applied to the memory 6 under test through the first interleave circuit $7_1$ and data signals read out from the memory 6 under test are distributed to the respective n logical comparators 1, 2, . . . n through the second interleave circuit $7_2$.

In such a manner, when an n-way interleave operation is effected by providing the n test pattern generators 1, 2, . . . n and the n failure analysis memories 1, 2, . . . n, a sequence data (address signals ADS, test data signals PD and control signals CS) can be applied to a memory 6 under test at the speed multiplied by the number of the test pattern generators, i.e., at the speed of n times.

FIG. 15 shows an example of input data signals IN1, IN2, . . . INn generated at the same time from the n test pattern generators 1, 2, . . . n, respectively, to be applied to the memory 6 under test. These input data signals IN1, IN2, . . . INn are arranged into a serial form of n input data IND1, IND2, . . . INDn one input data from one of the respective test pattern generators 1, 2, . . . n in the first cycle of the interleave operation. These input data IND1, IND2, . . . INDn in the serial form are supplied to the first interleave circuit $7_1$ in the order of IND1, IND2, . . . INDn at the speed of n times of the operation rate of a single test pattern generator. Next, in the second cycle of the interleave operation, a serial form of n input data IND(n+1), IND(n+2), . . . IND2n one input data from one of the respective test pattern generators 1, 2, . . . n are supplied to the first interleave circuit $7_1$ in the order of IND(n+1), IND(n+2), . . . IND2n at the speed of n times of the operation rate of a single test pattern generator. After that, in the succeeding interleave operations, a serial form of input data IND(2n+1) and the following data generated by the respective n test pattern generators 1, 2, . . . n are likewise supplied to the first interleave circuit $7_1$ at the speed of n times of the operation rate of a signal test pattern generator.

The first n input data IND1 through INDn supplied to the first interleave circuit $7_1$ are read out from the first interleave circuit $7_1$ and are supplied to the memory 6 under test in the order of the input data IND1, IND2, . . . INDn at the speed of n times of the operation rate of a single test pattern generator. The second n input data IND(n+1) through IND2n supplied to the first interleave circuit $7_1$ are also read out from the first interleave circuit $7_1$ and are supplied to the memory 6 under test in the order of IND(n+1), IND(n+2), . . . IND2n at the speed of n times of the operation rate of a single test pattern generator.

After that, in the succeeding cycles, n input data starting input data IND(2n+1) generated by the respective n test pattern generators 1, 2, . . . n are likewise read out from the first interleave circuit $7_1$ and are supplied to the memory 6 under test at the speed of n times of the operation rate of a single test pattern generator. In such a way, the input data signals IN1, IN2, . . . INn generated at the same time by the respective n test pattern generators 1, 2, . . . n are applied to the memory 6 under test at the speed of n times of the operation rate of a single pattern generator by the n-way interleave operation as shown in FIG. 15 at the last line thereof as a pattern applied to memory under test (applied pattern to memory under test) IN.

On the other hand, the test results for the input data signals IN1, IN2, . . . INn applied to the memory 6 under test at high speed through the first interleave circuit $7_1$ are read out from the memory 6 under test to the second interleave circuit $7_2$ in the same order as that of the input data signals applied to the memory 6 under test and at the speed of n times of the operation rate of a single test pattern generator.

FIG. 16 shows an example of output signals OUT1, OUT2, . . . OUTn of the test results read out from the memory 6 under test to the second interleave circuit $7_2$. In the first cycle of the interleave operation, these output data signals OUT1, OUT2, . . . OUTn are read out from the memory 6 under test to the second interleave circuit $7_2$ as a serial form of n output data OUT1, OUT2, . . . OUTn at the speed of n times of the operation rate of a single test pattern generator and in the same order as the reading out order. Then, the read out data signals are distributed to the respective n logical comparators 1, 2, . . . n. In the second cycle of the interleave operation, the output data signals are read out as a serial form of n output data OUTD (n+1), OUTD (n+2), . . . OUTD 2n from the memory 6 under test to the second interleave circuit $7_2$ at the speed of n times of the operation rate of a single test pattern generator and in the same order as the reading out order. Then, the read out data signals are distributed to the respective n logical comparators 1, 2, . . . n. After that, in the third cycle and the following cycles of the interleave operation, a serial form of n output data starting OUTD(2n+1), . . . are likewise read out from the memory 6 under test to the second interleave circuit $7_2$ at the speed of n times of the operation rate of a single pattern data generator and in the same order as the reading out order. Then, the read out data signals are distributed to the respective n logical comparators 1, 2, . . . n.

In those logical comparators 1, 2, . . . n, the test results, i.e., the output data signals OUT1, OUT2, . . . OUTn supplied from the second interleave circuit $7_2$ are compared with the expected value data signals ED1, ED2, . . . EDn supplied from the corresponding test pattern generators 1, 2, . . . n, respectively. Then, the comparison results are stored in the corresponding n failure analysis memories 1, 2, . . . n, respectively. The order of storing the comparison results into these failure analysis memories 1, 2, . . . n is as shown in FIG. 16 at the first line thereof as a read out data from memory under test OUT. The storing operations of these comparison results into the n failure analysis memories 1, 2, . . . n are performed simultaneously for each cycle.

In the semiconductor memory testing apparatus constructed as mentioned above for performing an n-way interleave operation, the n respective test pattern generators 1, 2, . . . n and the n respective failure analysis memories 1, 2, . . . n are used. When an interleave pattern shown in FIG. 15 is generated, the comparison test results, i.e., the read out output data signals OUT1, OUT2, . . . OUTn are distributed and stored in the n respective failure analysis memories 1, 2, . . . n as shown in FIG. 16. As mentioned above, the data storing operations into the n respective failure analysis memories 1, 2, . . . n are performed at the same time for n data signals for each interleave cycle. Therefore, as a result of the logical comparisons in the respective logical comparators 1, 2, . . . n, if at least a failure is detected in n data in each interleave cycle, this failure data must be stored in a failure analysis memory. However, as mentioned above, since n data in each interleave cycle are stored in the respective failure analysis memories, other data in the same cycle having no failure are also stored in the respective failure analysis memories as data indicating that "there is no failure therein".

FIG. 17 shows an example of a data storage state of each failure analysis memory in the case where n data in each of the first through the ninth interleave cycles are stored at the same time in the respective n failure analysis memories 1, 2, . . . n as a result of the failure data detection. In FIG. 17, each block indicated by slant lines shows a data in which a failure is detected. Therefore, FIG. 17 shows that there is a failure in the n-th data n-1 among the n data 1-1, 2-1, 3-1, . . . n-1 in the first cycle, that there is a failure in each of the first data 1-2 and the third data 3-2 among the n data 1-2, 2-2, 3-2, . . . n-2 in the second cycle, and that there is a failure in the first data 1-3 among the n data 1-3, 2-3, 3-3, . . . n-3 in the third cycle. Similarly, after that, FIG. 17 shows that there is a failure in the n-th data n-9 among the n data 1-9, 2-9, 3-9, . . . n-9 in the ninth cycle. However, in this case, since all the n data of each interleave cycle are stored, it can not be identified at the present time to which interleave cycle a data in which a failure occurred belongs.

Further, there is a method for using a failure analysis memory wherein the number of failures is counted and the data are stored until the count value reaches a prescribed value. However, in this case, since n data are stored simultaneously in the n respective failure analysis memories 1, 2, . . . n, there is a disadvantage that the number of data stored in the failure analysis memories exceeds the prescribed value of the number of failures by +1 data cycle to +(n-1) data cycles.

Further, since each cycle (interleave cycle) of an interleave operation contains n data, each cycle of an interleave operation will be expressed as an interleave cycle and n data will be expressed as data cycles in the description hereinafter.

DISCLOSURE OF THE INVENTION

It is an object of the present invention to provide a semiconductor memory testing method in which the aforementioned problems are solved and an apparatus for implementing this method.

According to a first aspect of the present invention, there is provided a method of testing a semiconductor memory comprising the steps of: writing test data signals generated from a plurality of test pattern generators in a memory under test through a first interleave circuit by means of a first interleave operation; reading out the test result data from the memory under test through a second interleave circuit by means of a second interleave operation and distributing them to a plurality of logical comparators; comparing the test result data with expected value data supplied from the test pattern generators in the logical comparators, respectively; distributing, when the comparison result is failure, data in that interleave cycle containing the failure data to a plurality of failure analysis memories to store the data therein; generating failure data as well as a failure mark signal for indicating occurrence of failure from each of the plurality of logical comparators; storing the failure mark signal in the plurality of failure analysis memories in correspondence to the failure data; and sequentially reading out the failure mark signals from the failure analysis memories after the testing of the memory under test is completed to identify a data cycle in which a failure has occurred.

In the preferred embodiment, the interleave operation is a four-way interleave operation, an eight-way interleave operation or a sixteen-way interleave operation.

According to a second aspect of the present inventions there is provided a semiconductor memory testing apparatus for carrying out the method just described above wherein test data signals generated from a plurality of test pattern generators are written in a memory under test through a first interleave circuit by means of a first interleave operation, the test result data are read out from the memory under test through a second interleave circuit by means of a second interleave operation and are distributed to a plurality of logical comparators, the test result data are compared with expected value data supplied from the test pattern generators in the logical comparators, respectively, and when the comparison result is failure, data in that interleave cycle containing the failure data are distributed to and stored in a plurality of failure analysis memories, respectively, and the testing apparatus is characterized in that each of the logical comparators has a circuit for generating a failure mark signal indicating occurrence of a failure based on the failure data, and each of the plurality of failure analysis memories has a storage area for storing the failure mark signal generated from the corresponding logical comparator in correspondence to the failure data.

According to a third aspect of the present invention, there is provided a semiconductor memory testing apparatus which further comprises, in addition to the testing apparatus just described above, a failure counter for counting the failure mark signals and outputting a lower bit or bits of the count value; a prescribed value storing register for storing a prescribed value of the number of failures and outputting a lower bit or bits of the prescribed value; an adder for adding the lower bit output of the failure counter and the lower bit output of the prescribed value storing register; a constant adding circuit for adding a constant to the added result of the adder and outputting a lower bit or bits of the added result of the constant adding circuit; and a multiplexer supplied with the lower bit output of the adder and the lower bit output of the constant adding circuit for selectively outputting one of the output of the adder and the output of the constant adding circuit depending on the lower bit or bits of the prescribed value storing register.

In a preferred embodiment, the failure counter counts the failure mark signals and outputs lower two bits of the count value, and the prescribed value storing register outputs the least significant bit and lower two bits of the prescribed value of the number of failures, and the adder adds the lower two bit output of the failure counter and the lower two bit output of the prescribed value storing register and outputs lower two bits of the added result, and the constant adding circuit adds 2 to the lower two bit output of the adder, and the multiplexer is supplied with the lower two bit output of the adder and the lower two bit output of the constant adding circuit and selectively outputs one of the added result of the adder and the added result of the constant adding circuit depending on the least significant bit output of the prescribed value storing register.

In another preferred embodiment, the failure counter counts the failure mark signals and outputs lower three bits of the count value, and the prescribed value storing register outputs lower two bits and lower three bits of a prescribed value of the number of failures, and the adder adds the lower three bit output of the failure counter and the lower three bit output of the prescribed value storing register and outputs lower three bits of the added result, and the constant adding circuit comprises three circuits the first of which is a circuit for adding 2 to the lower three bit output of the adder, the second of which is a circuit for adding 4 to the lower three bit output of the adder and the third of which is a circuit for adding 6 to the lower three bit output of the adder, and the multiplexer is supplied with the lower three bit output of the adder and the lower three bit output of each of the three circuits of the constant adding circuit and selectively outputs one of the added result of the adder and the added result of the constant adding circuit depending on the lower two bit output of the prescribed value storing register.

In further preferred embodiment, the failure counter counts the failure mark signals and outputs lower four bits of the count value, and the prescribed value storing register outputs lower three bits and lower four bits of the prescribed value of the number of failures, the adder adds the lower four bit output of the failure counter and the lower four bit output of the prescribed value storing register and outputs lower four bits of the added result, and the constant adding circuit comprises seven circuits the first of which is a circuit for adding 2 to the lower four bit output of the adder, the second of which is a circuit for adding 4 to the lower four bit output of the adder, the third of which is a circuit for adding 6 to the lower four bit output of the adder, the fourth of which is a circuit for adding 8 to the lower four bit output of the adder, the fifth of which is a circuit for adding "A" to the lower four bit output of the adder, the sixth of which is a circuit for adding "C" to the lower four bit output of the adder, and the seventh of which is a circuit for adding "E" to the lower four bit output of the adder, and the multiplexer is supplied with the lower four bit output of the adder and the lower four bit output of each of the seven circuits of the constant adding circuit and selectively outputs one of the added result of the adder and the added result of the constant adding circuit depending on the lower three bit output of the prescribe value storing register.

BRIEF DESCRIPTION OF THE DRAWINGS

FIG. 4 is a table showing input/output data in the over-run number calculating circuit of FIG. 3;

FIG. 6 is a table showing input/output data in the over-run number calculating circuit of FIG. 5;

FIG. 8 is a table showing input/output data in the over-run number calculating circuit of FIG. 7;

FIG. 9 is a table showing input/output data in the over-run number calculating circuit of FIG. 7;

FIG. 10 is a table showing input/output data in the over-run number calculating circuit of FIG. 7;

FIG. 11 is a table showing input/output data in the over-run number calculating circuit of FIG. 7;

BEST MODES FOR CARRYING OUT THE INVENTION

The embodiments of the present invention now will be described in detail with reference to the accompanying drawings.

Figure 14:
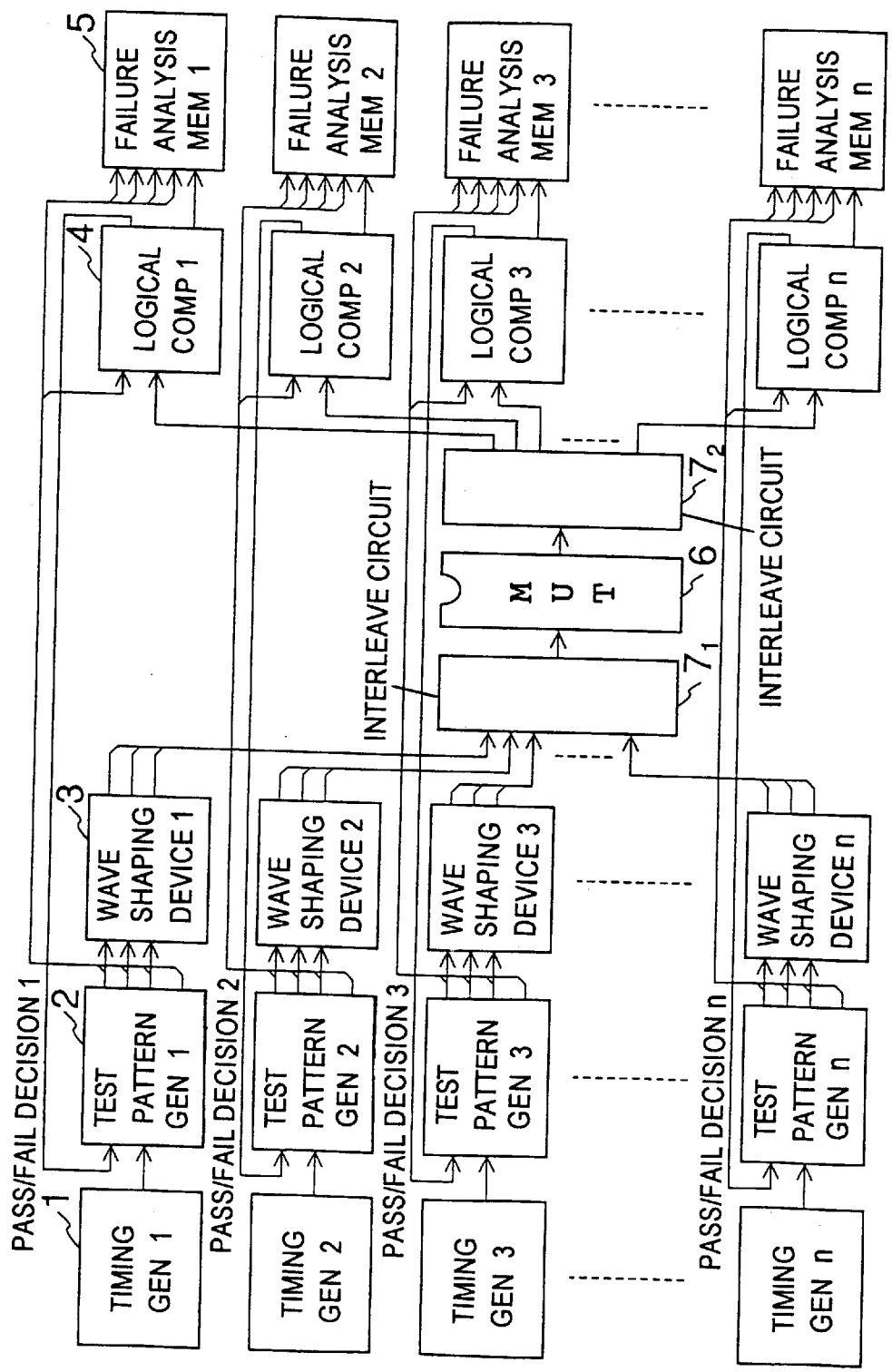
FIG. 14 is a block diagram showing an example of the basic construction of a conventional semiconductor memory testing apparatus in which an interleave operation is performed.
Figure 15:
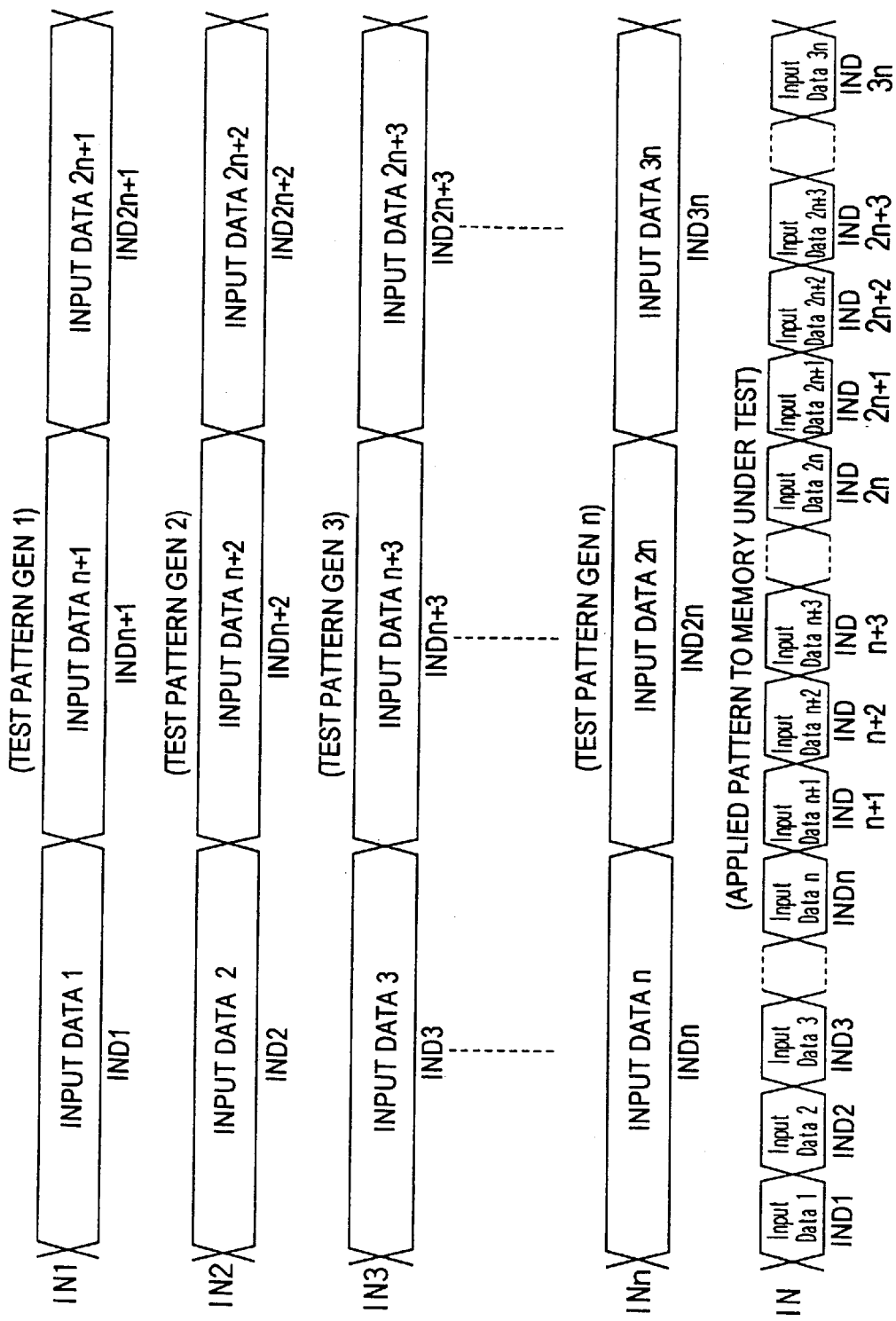
FIG. 15 is a timing diagram for explaining a timing of test data writing in the conventional semiconductor memory testing apparatus of FIG. 14.
Figure 16:
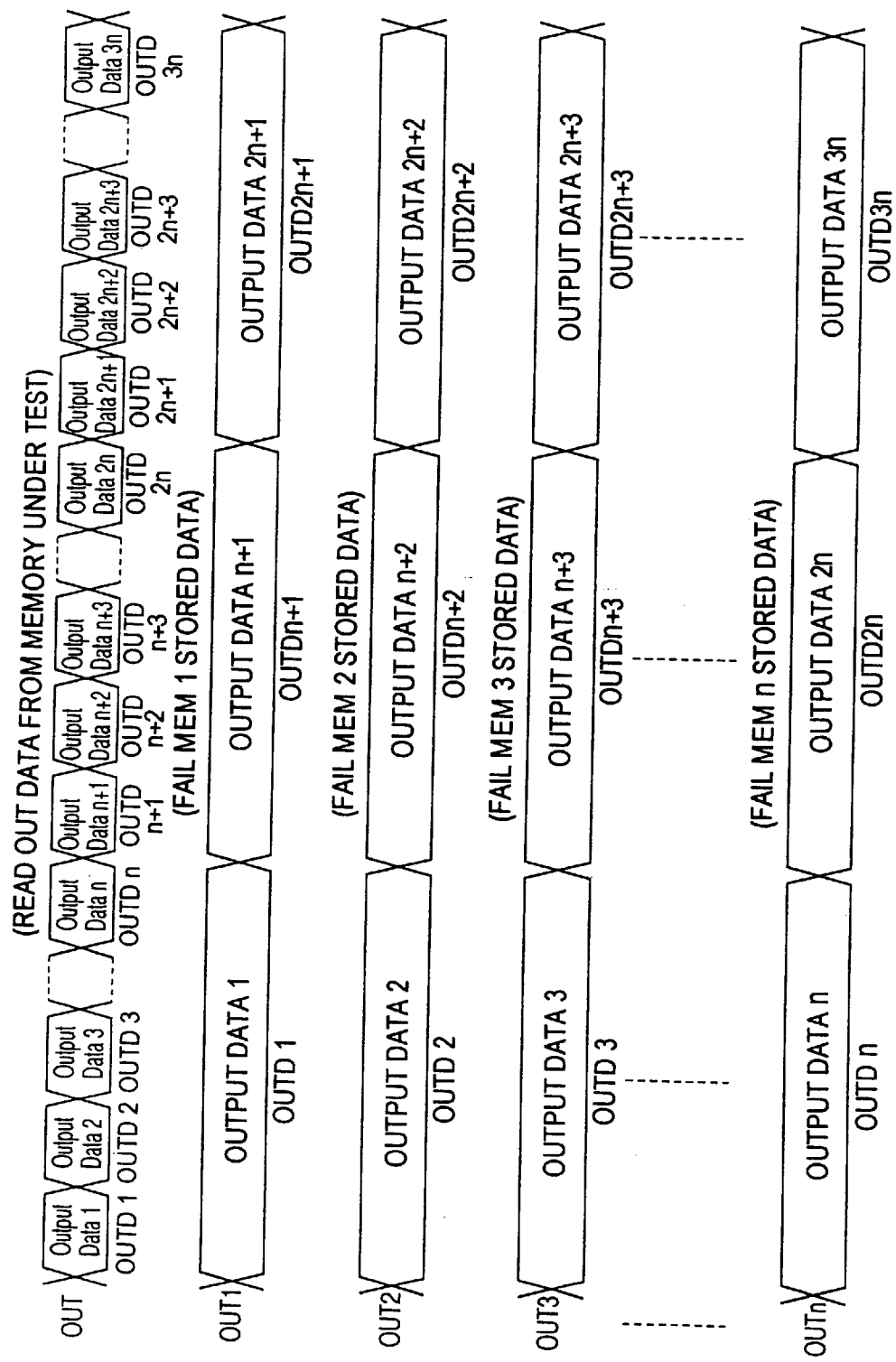
FIG. 16 is a timing diagram for explaining a timing of test data reading in the conventional semiconductor memory testing apparatus of FIG. 14.
Figure 17:
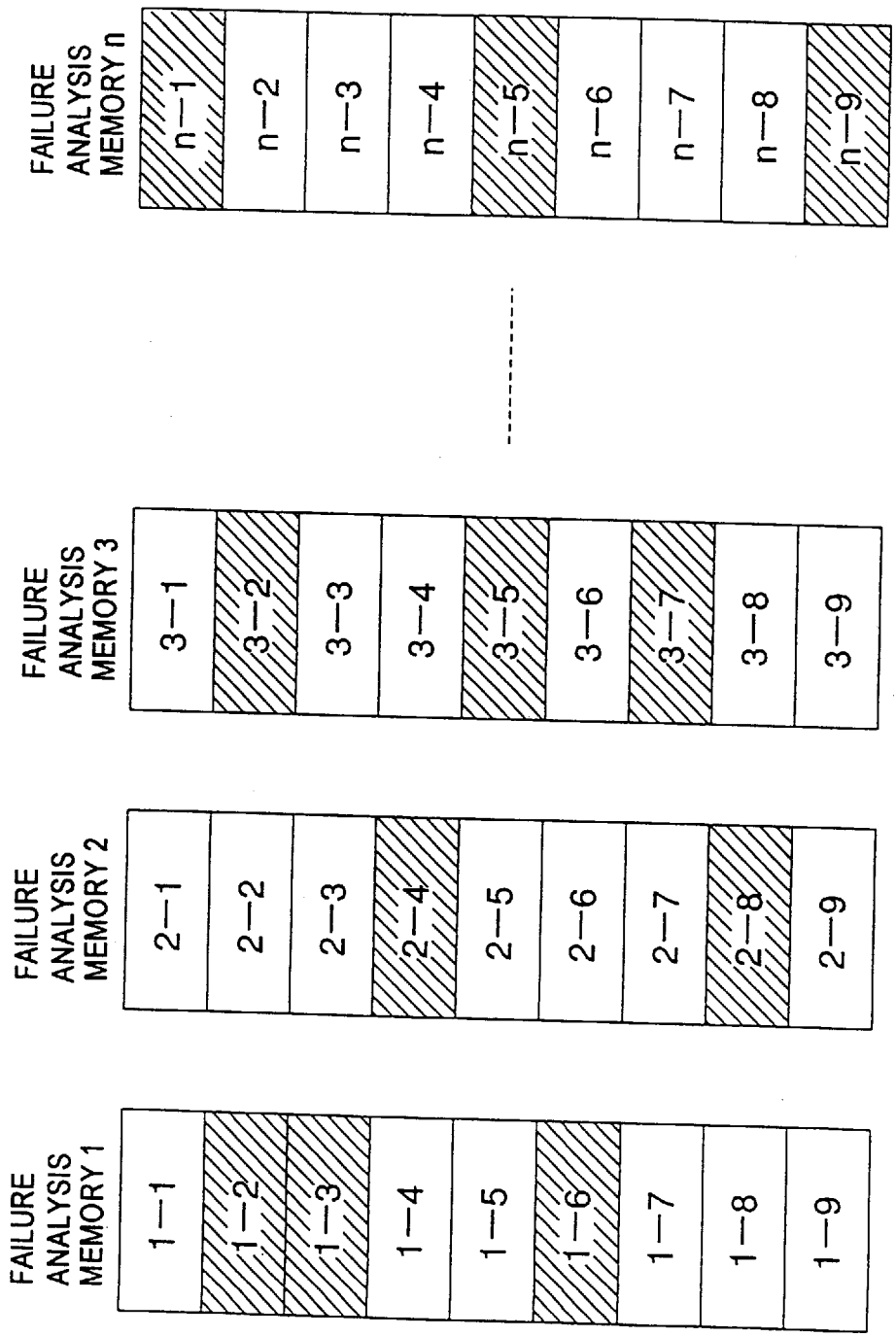
FIG. 17 is a diagram for conceptually showing an example of the data storage state in n respective failure analysis memories of the conventional semiconductor memory testing apparatus.

First, a first embodiment of the semiconductor memory testing method according to the present invention and a first embodiment of the semiconductor memory testing apparatus according to the present invention will be described with reference to FIG. 1. The present invention is premised on a conventional semiconductor memory testing apparatus as shown in FIG. 14 which performs an interleave operation. Since the present invention is particularly applied to the failure analysis memory 5 thereof, in FIG. 1 only the failure analysis memory and the associated circuits, devices, etc. are shown. Further, in FIG. 1, a logical comparator $4_1$ is shown as a representative of one of the n respective logical comparators 4 in the semiconductor memory testing apparatus shown in FIG. 14, and likewise a failure analysis memory $5_1$ is shown as a representative of one of the n respective failure analysis memories 5.

An output data signal of the test results which is read out from a memory 6 under test through a second interleave circuit $7_2$ (see FIG. 14) is supplied to the logical comparator $4_1$. In addition, an expected value data signal (an expected value data 1) EXP data 1 is also supplied to the logical comparator $4_1$ from a corresponding test pattern generator $2_1$. These signals are compared with each other in the logical comparator $4_1$. When the comparison result is a failure, a failure data 1 (FAIL DATA 1) is outputted from the logical comparator $4_1$ and is stored in a corresponding failure analysis memory $5_1$.

In the present invention, the logical comparator $4_1$ compares, as usual, a test result output data signal read out from a memory 6 under test with an expected value data signal from a test pattern generator $2_1$ and outputs a failure data, and also has a circuit for generating a failure mark signal (FAIL MARK SIG 1) which indicates that a failure has occurred based on the failure data. Therefore, the logical comparator $4_1$ is arranged so as to output not only a failure data but also a failure mark signal therefrom.

Figure 2:
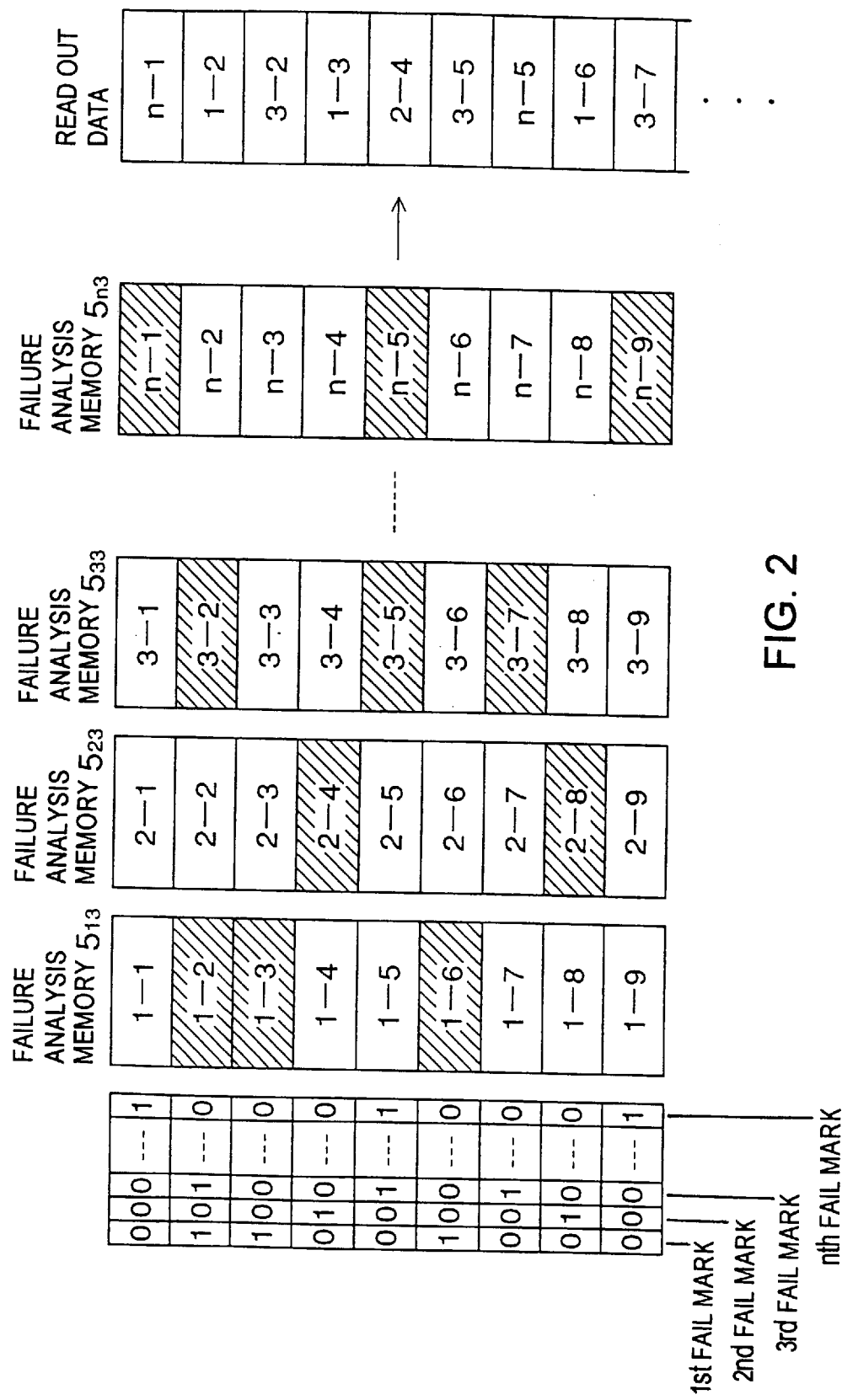
FIG. 2 is a diagram for conceptually showing an example of the data storage state of n respective failure analysis memories in a semiconductor memory testing apparatus to which the present invention is applied.

The failure analysis memory $5_1$ comprises a memory control circuit (MEM CONT CCT) $5_{12}$ and a memory area $5_{13}$, and the memory control circuit $5_{12}$ controls writing and reading of a failure data to/from the failure analysis memory $5_1$. The memory area $5_{13}$ has a memory area for storing a failure data 1 and a memory area for storing a failure mark signal. FIG. 2 conceptually shows these areas.

Figure 1:
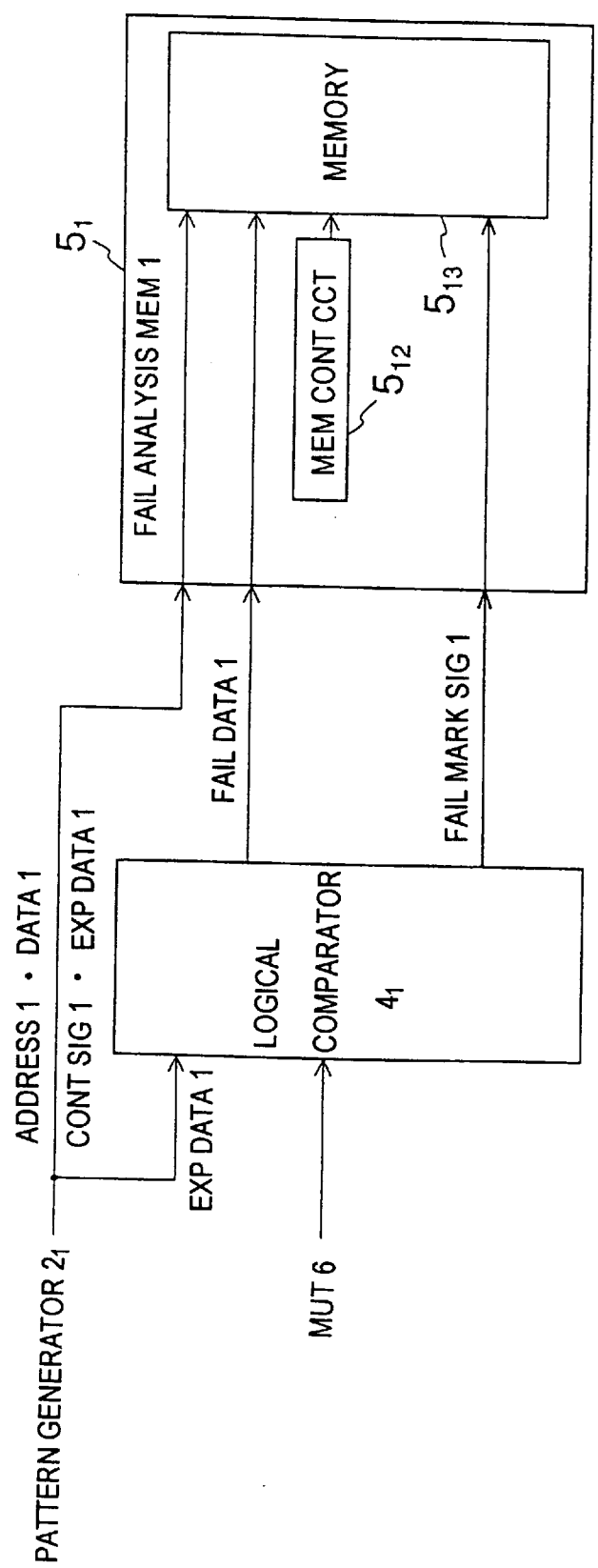
FIG. 1 is a block diagram showing portions of a logical comparator and a failure analysis memory of a first embodiment of the semiconductor memory testing apparatus according to the present invention.

In FIG. 2, the memory area $5_{13}$ shows a memory area of the failure analysis memory $5_1$ shown in FIG. 1 and the memory area $5_{23}$ shows a memory area of the failure analysis memory $5_2$ (not shown), and similarly, the memory area $5_{n3}$ shows a memory area of the failure analysis memory $5_n$ (not shown). In the reference numerals 1-1 through n-9 written in rectangular blocks of these memory areas $5_{13}$–$5_{n3}$, a left side numeral indicates a failure analysis memory and a right side numeral indicates a data cycle. As can be easily understood from the drawing, a left side numeral "1" indicates the failure analysis memory $5_1$, a left side numeral "2" indicates the failure analysis memory $5_2$, and similarly, left side numeral "n" indicates the failure analysis memory $5_n$. On the other hand, a right side numeral "1" indicates first interleave cycle, a right side numeral "2" indicates second interleave cycle, and similarly, a right side numeral "9" indicates ninth interleave cycle. In this example, each interleave cycle includes n data cycles and the data signals are applied to a memory under test from the first interleave cycle to ninth interleave cycle. Therefore, FIG. 2 shows an example of the data distributed and stored in the respective failure analysis memories when the data of n data cycles in each interleave cycle are stored in the n respective failure analysis memories $5_1$–$5_n$ at the same time.

These memory areas $5_{13}$–$5_{n3}$ comprise memory areas for storing failure data of n data cycles of the respective interleave cycles indicated by the above reference numerals and the corresponding memory areas for storing failure mark signals. However, in FIG. 2, the memory areas for storing failure mark signals are separately and collectively shown in the left side of the figure according to convenience of the explanation. In the failure mark signal memory areas collectively shown, the first longitudinal blocks (first failure mark) of the leftmost side indicate failure mark signal memory areas associated with the memory area $5_{13}$, the second longitudinal blocks (second failure mark) of second column from the left indicate failure mark signal memory areas associated with the memory area $5_{23}$, and similarly, the nth longitudinal blocks (nth failure mark) of the rightmost side indicate failure mark signal memory areas associated with the memory area $5_{n3}$.

FIG. 2, a block indicated by slant lines shows a data cycle in which a failure is detected. Therefore, FIG. 2 shows that a failure is detected in the n-th data cycle n-1 among the n data cycles 1-1, 2-1, 3-1, ... n-1 in the first interleave cycle, that a failure is detected in each of the first and -he third data cycles 1-2 and 3-2 among the n data cycles 1-2, 2-2, 3-2, ... n-2 in the second interleave cycle, that a failure is detected in the first data cycle 1-3 among the n data cycles 1-3, 2-3, 3-3, ... n-3 in the third interleave cycle, and similarly, that a failure is detected in the n-th data cycle n-9 among the n data cycles 1-9, 2-9, 3-9, ... n-9 in the ninth interleave cycle. On the other hand, in the left side failure mark signal memory areas, a block in which "1" is written indicates that a failure is detected. Therefore, "1" in the failure mark signal memory areas corresponds to a data cycle indicated by slant lines in each memory areas $5_{13}$–$5_{n3}$.

After the test of the memory 6 under test is finished, a failure analysis of the memory 6 under test is carried out by analyzing the stored contents of the n respective failure analysis memories in which failure data are stored. In the failure analysis, only failure mark signal memory areas in the memory areas $5_{13}$–$5_{n3}$ of the n respective failure analysis memories 5 are sequentially scanned. Then, failure mark signals are read out from the n respective failure analysis memories 5 in the manner collectively shown in the left side of FIG. 2 and are stored in an external memory. The value "1" in the read out failure mark signals indicates that a failure exists in the corresponding data cycle. Therefore, in the reading of the failure mark signals, when the only data cycles which outputted value "1" are sequentially read out from the n respective failure analysis memories 5 and are stored in the external memory, the read out data as shown in the right side of FIG. 2 are obtained. That is, the only data cycles in which the failure data are stored can be read out from the n respective failure analysis memories 5.

In such a way, according to the present invention, the stored data of the only data cycles in which failures are detected can be read out in the sequence of the failure occurrences from the data of n data cycles stored at the same time in the n respective failure analysis memories 5 by using the failure mark signals.

Next, a second embodiment of the semiconductor memory testing method and apparatus according to the present invention will be explained referring to FIG. 3. This second embodiment shows a case in which the present invention is applied to a semiconductor memory testing method and a semiconductor memory testing apparatus wherein a failure analysis memory using method in which the number of failures of the memory under test is counted and the failure data are stored in the failure analysis memory until the number of counts reaches a prescribed value, and no more failure data are stored in the failure analysis memory when the number of counts reaches the prescribed value, is employed.

As mentioned above, in the present invention, a conventional semiconductor memory testing apparatus which performs an interleave operation as shown in FIG. 14 is a prerequisite. Since the present invention is applied particularly to a circuit or an apparatus portion associated with counting of the number of failures of the memory 6 under test, only a basic configuration of a portion to which the present invention is applied is shown in FIG. 3.

Figure 3:
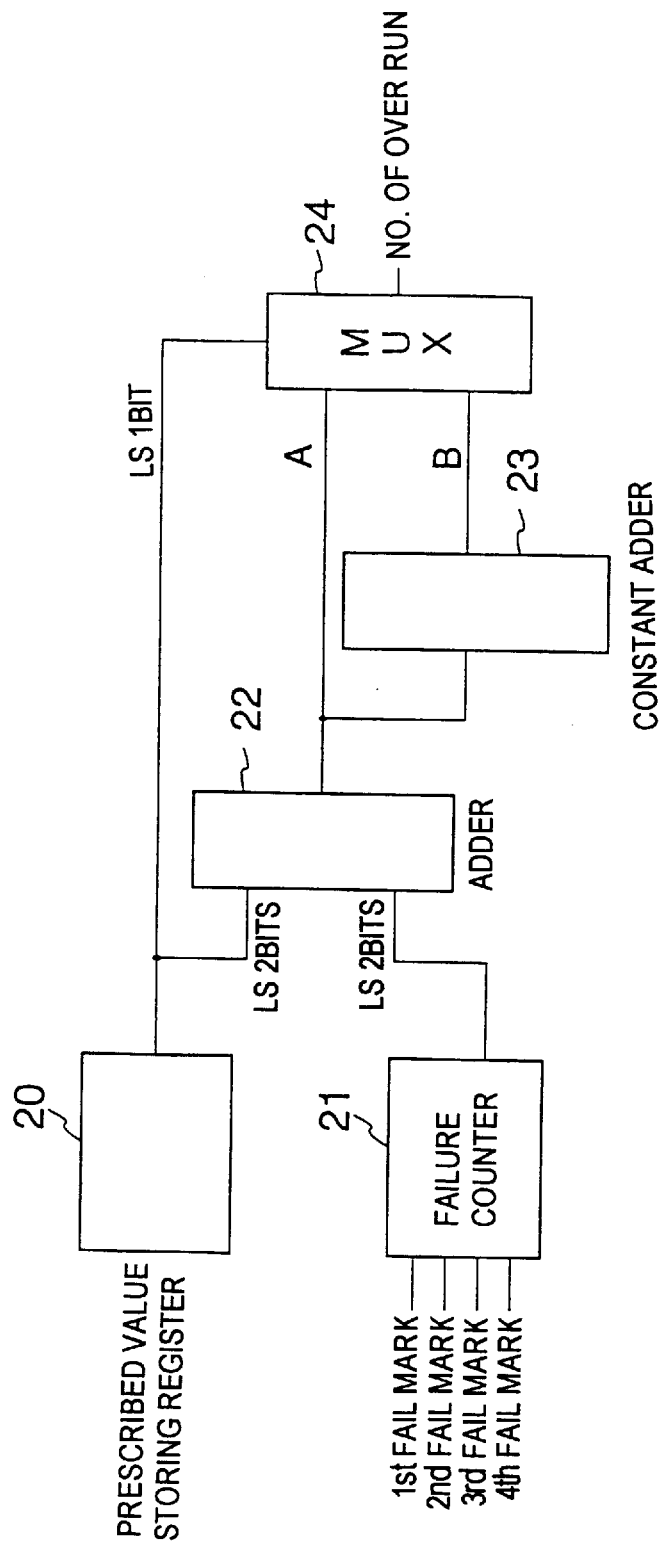
FIG. 3 is a block diagram showing an over-run number calculating circuit used in a second embodiment of the semiconductor memory testing apparatus according to the present invention in a four-way interleave operation thereof.

FIG. 3 shows an over-run number calculating circuit used to calculate the number of data which over-run the prescribed value of the number of failures and are stored in the failure analysis memory when a four-way interleave operation is performed. In a semiconductor memory testing apparatus for performing a four-way interleave operation, the over-run number can be calculated using lower two (LS 2) bits (or least significant two bits) of the prescribed value of the number of failures, lower two (LS 2) bits (or least significant two bits) of the number of counts of the failure mark signals and the least significant bit of the prescribed value of the number of failures.

The over-run number calculating circuit shown as an example comprises a prescribed value storing register 20 for storing a prescribed value of the number of failures, a failure counter 21 for counting the number of failures, an adder 22 to which the lower two bits of the prescribed value of the number of failures and the lower two bits of the number of counts are inputted for performing an adding operation, a constant adding circuit 23 for adding 2 to the added result of the adder 22, and a multiplexer 24 to which an added result A of the adder 22, an added result B (=A+2) of the constant adding circuit 23 for adding 2 to the added result A, and the least significant bit of the prescribed value of the number of failures stored in the prescribed value storing register 20 are inputted for outputting the added result A when the least significant bit of the prescribed value is "0", and for outputting the added result B when the least significant bit of the prescribed value is "1".

Next, the operation of the over-run number calculating circuit arranged as mentioned above will be explained. The lower two bits of the prescribed value of the number of failures and the lower two bits of the number of counts are inputted to the adder 22 from the prescribed value storing register 20 and the failure counter 21 respectively and are summed. As shown in FIG. 4, the cases of the lower two bits of the prescribed value of the number of failures are "00", "01", "10", "11", and the cases of the lower two bits of the counter 21 in each cycle are "00", "01", "10", "11". Therefore, the added result A of these numbers is obtained as shown in FIG. 4. In addition, the result B which is the sum of the added result A and 2 is obtained as shown in FIG. 4. AS mentioned above, the multiplexer 24 selects the added result A when the least significant bit of the prescribed value of the number of failures is "0" and selects the added result B when the least significant bit of the prescribed value of the number of failures is "1". Therefore, as shown in the column of the number of over-runs in FIG. 4, the number of data which over-run the prescribed value of the number of failures and are stored in the failure analysis memory (the number of over-runs) is outputted from the multiplexer 24.

The failure mark signals each indicating an occurrence of a failure are counted by the failure counter 21 and when the number of counts becomes equal to or greater than the prescribed value, the storing operation of the failure data into the failure analysis memory is stopped. Therefore, as explained in the above first embodiment, the stored data of the only data cycles in which failures are detected are read out in the sequence of the occurrences from the data of four data cycles, i.e., the first through the fourth data cycles, stored in the four units of the failure analysis memories using the failure mark signals. After that, the data Cycles which have over-run the prescribed value can be obtained by processing the number of counts of the failure mark signals and the prescribed value. Then, by removing the data cycles which have over-run the prescribed value from the stored data rearranged in the sequence of the occurrences, valid data can be read out.

Figure 5:
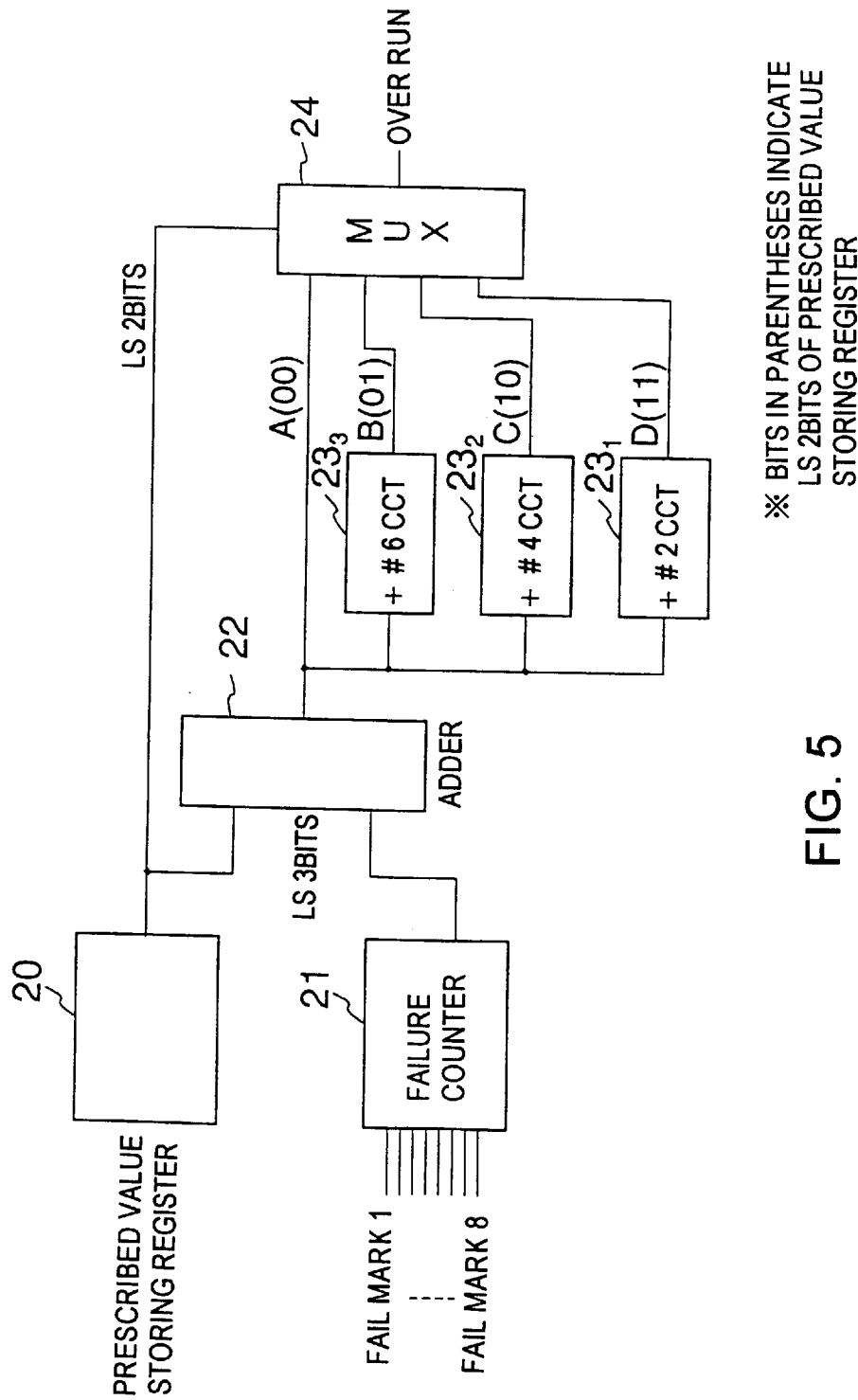
FIG. 5 is a block diagram showing an over-run number calculating circuit used in the second embodiment of the semiconductor memory testing apparatus according to the present invention in eight-way interleave operation thereof.

FIG. 5 shows an over-run number calculating circuit used to calculate the number of data which over-run the prescribed value of the number of failures and are stored in the failure analysis memory when an eight-way interleave operation is performed. In a semiconductor memory testing apparatus for performing an eight-way interleave operation, the over-run number can be calculated using lower three (LS 3) bits (or least significant three bits) and lower two bits (or least significant two bits) of the prescribed value of the number of failures and lower three bits (or least significant three bits) of the number of counts of the failure mark signals.

The over-run number calculating circuit shown as an example comprises a prescribed value storing register 20 for storing a prescribed value of the number of failures, a failure counter 21 for counting the number of failures, an adder 22 to which the lower three bits of the prescribed value of the number of failures and the lower three bits of the number of counts are inputted for performing an adding operation and for outputting lower three bits of the added result, three constant adding circuits $23_1$, $23_2$ and $23_3$ for adding three different constants, 2, 4 and 6 respectively in this example, to the added result (lower three bits) of the adder 22 to output the added results, and a multiplexer 24 to which the added result A of the adder 22, the added results D (=A+2), C (=A+4), B (=A+6) of the respective three constant adding circuits $23_1$, $23_2$, $23_3$ in which 2, 4, 6 are respectively added to the added result A of the adder 22, and the lower two bits of the prescribed value of the number of failures stored in the prescribed value storing register 20 are inputted for outputting the added result A when the lower two bits of the prescribed value are "00", for outputting the added result B when the lower two bits of the prescribed value are "01", for outputting the added result C when the lower two bits are "10", and for outputting the added result D when the lower two bits are "11".

Next, the operation of the over-run number calculating circuit arranged as mentioned above will be explained. The lower three bits of the prescribed value of the number of failures and the lower three bits of the number of counts are inputted to the adder 22 from the prescribed value storing register 20 and the failure counter 21 respectively and are summed. As shown in FIG. 6, the cases of the lower three bits of the prescribed value of the number of failures are "000", "001", "010", "011", "100", "101", "110", "111", and the cases of the lower three bits of the counter 21 in each cycle are "000", "001", "010", "011", "100", "101", "110", "111". Therefore, the added result A of these numbers is obtained as shown in FIG. 6. In addition, the result D which is the sum of the added result A and 2, the result C which is the sum of the added result A and 4, and the result B which is the sum of the added result A and 6 are obtained as shown in FIG. 6. As mentioned above, the multiplexer 24 outputs the added result A when the lower two bits of the prescribed value of the number of failures are "00", outputs the added result B when the lower two bits are "01", outputs the added result C when the lower two bits are "10", and outputs the added result D when the lower two bits are "11". Therefore, as shown in the column of the number of over-runs in FIG. 6, the number of data which over-run the prescribed value of the number of failures and are stored in the failure analysis memory (the number of over-runs) is outputted from the multiplexer 24.

Figure 7:
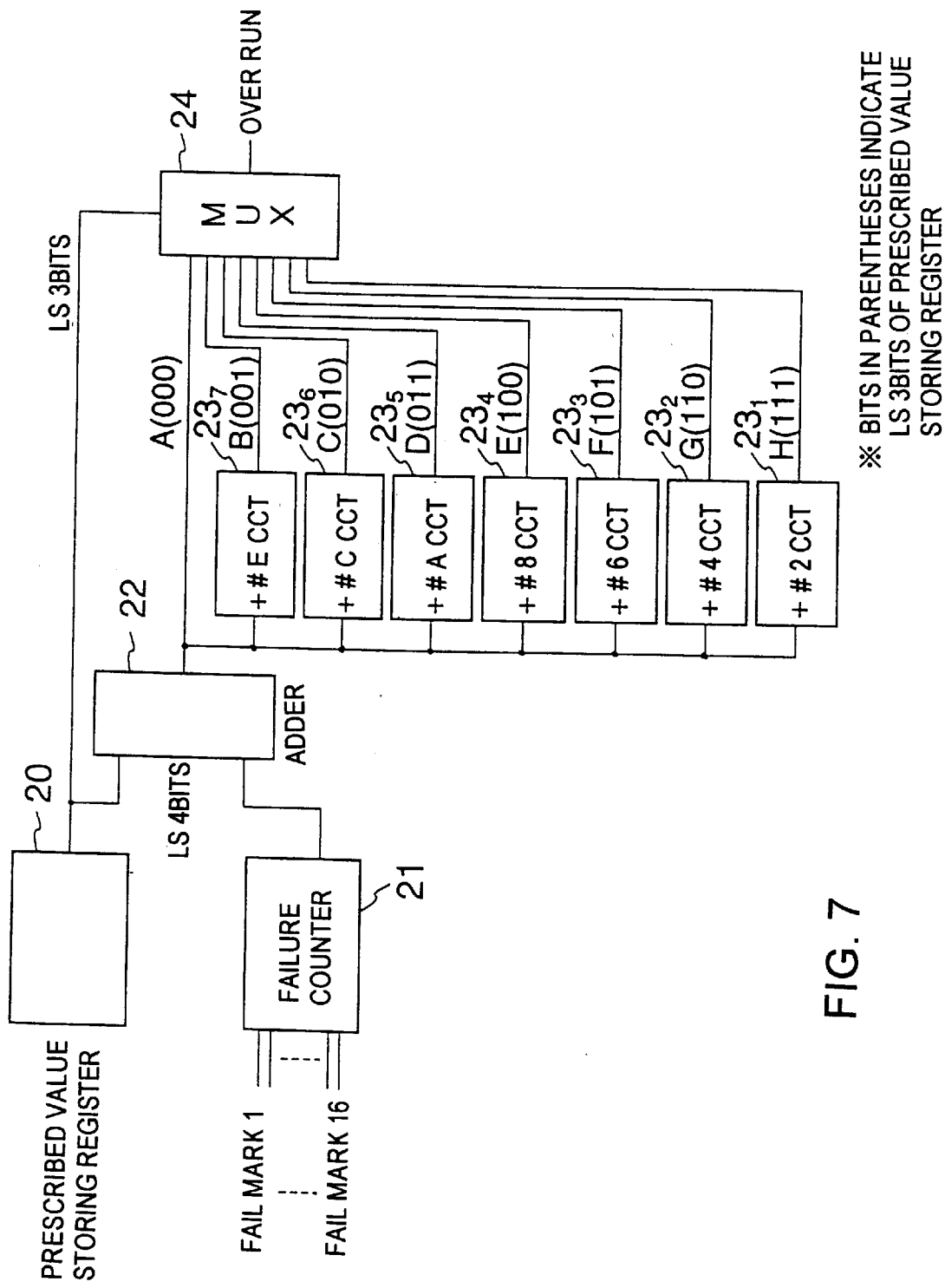
FIG. 7 is a block diagram showing an over-run number calculating circuit used in the second embodiment of the semiconductor memory testing apparatus according to the present invention in sixteen-way interleave operation thereof.
Figure 12:
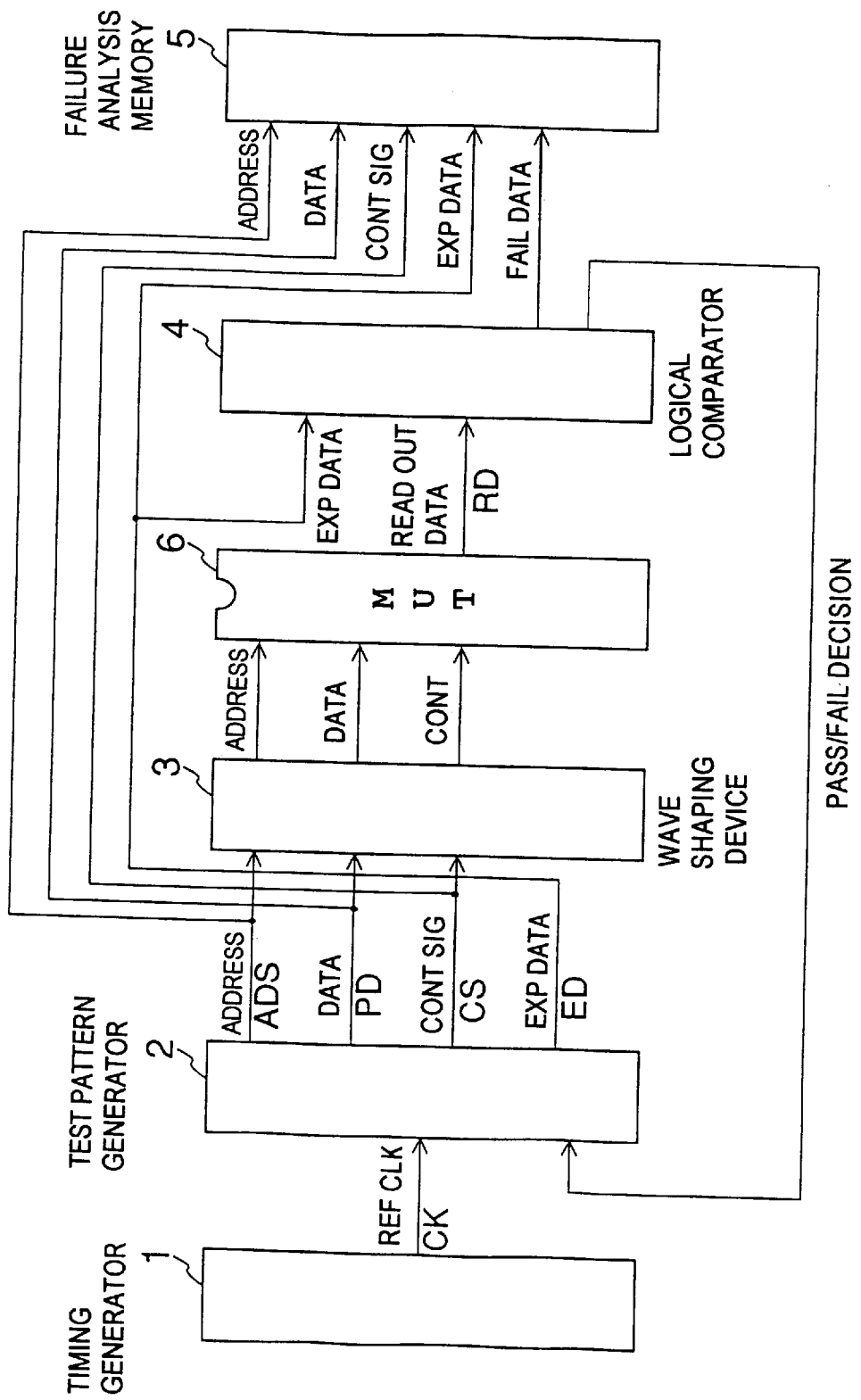
FIG. 12 is a block diagram showing an example of the basic construction of a conventional semiconductor memory testing apparatus.
Figure 13:
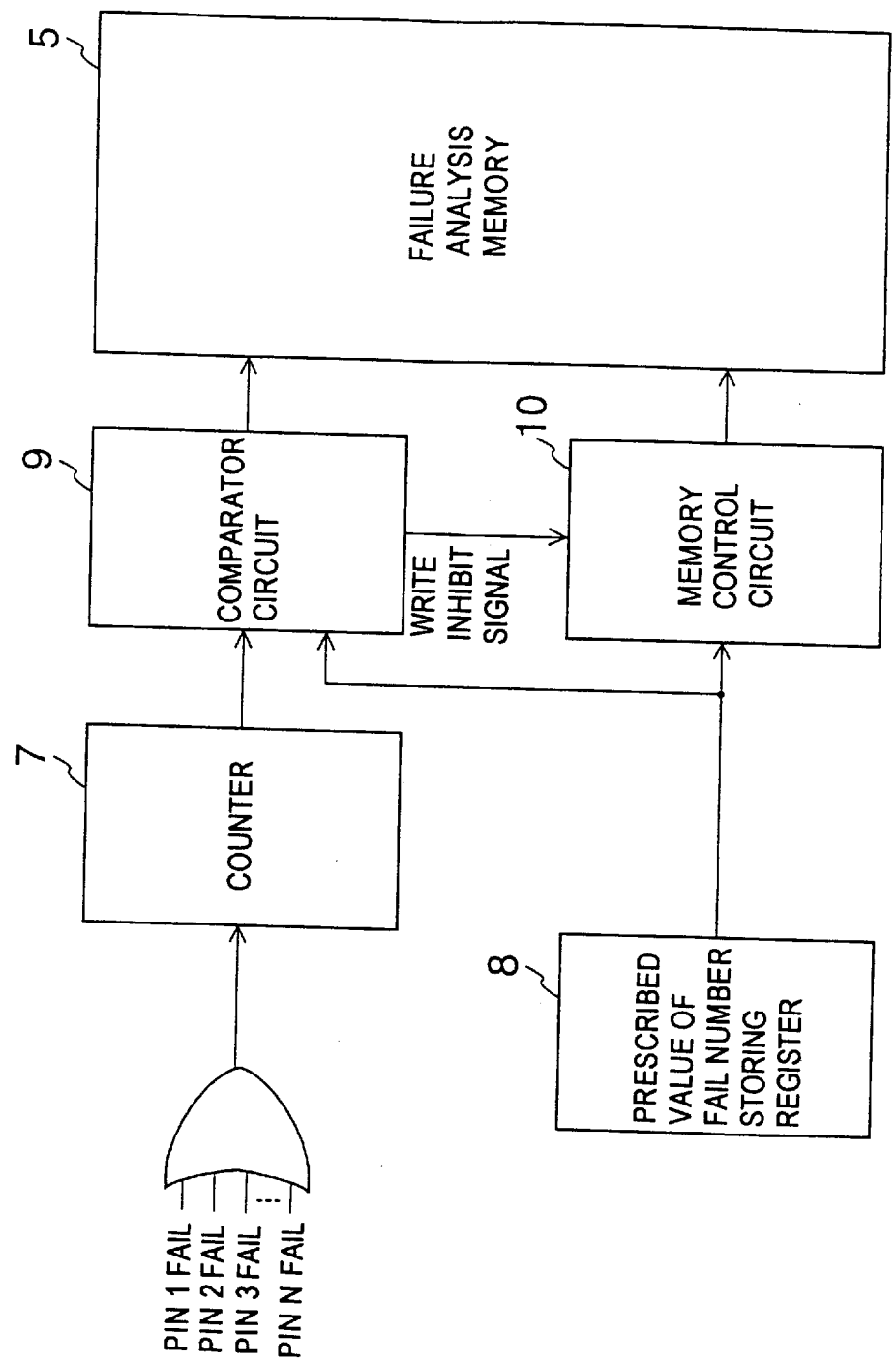
FIG. 13 is a block diagram showing an example of the circuit for counting and comparing the number of failures in the conventional semiconductor memory testing apparatus.

FIG. 7 shown an over-run number calculating circuit used to calculate the number of data which over-run the prescribed value of the number of failures and are stored in the failure analysis memory when a sixteen-way interleave operation is performed. In a semiconductor memory testing apparatus for performing a sixteen-way interleave operation, the over-run number can be calculated using lower four (LS 4) bits (or least significant four bits) and lower three bits (or least significant three bits) of the prescribed value of the number of failures and lower four bits (or least significant four bits) of the number of counts of the failure mark signals.

The over-run number calculating circuit shown as an example comprises a prescribed value storing register 20 for storing a prescribed value of the number of failures, a failure counter 21 for counting the number of failures, an adder 22 to which the lower four bits of the prescribed value of the number of failures and the lower four bits of the number of counts are inputted for performing an adding operation and for outputting lower four bits of the added result, seven constant adding circuits $23_1$, $23_2$, $23_3$, $23_4$, $23_5$, $23_6$ and $23_7$ for adding seven different constants, 2, 4, 6, 8, A (a hexadecimal digit), C (a hexadecimal digit) and E (a hexadecimal digit) respectively in this example, to the added result (lower four bits) of the adder 22 to output the added results, and a multiplexer 24 to which the added result A of the adder 22, the added results H (=A+2), G (=A+4), F (=A+6), E (=A+8), D (A+A), C (A+C), B (=A+E) of the respective seven adding circuits $23_1$, $23_2$, $23_3$, $23_4$, $23_5$, $23_6$, $23_7$ in which 2, 4, 6, 8, A, C, E are respectively added to the added result A of the adder 22, and the lower three bits of the prescribed value of the number of failures stored in the prescribed value storing register 20 are inputted for selecting and outputting the added result A when the lower three bits of the prescribed value are "000", for outputting the added result B when the lower three bits are "001", for outputting the added result C when the lower three bits are "010", for outputting the added result D when the lower three bits are "011", for outputting the added result E when the lower three bits are "100", for outputting the added result F when the lower three bits are "101", for outputting the added result G when the lower three bits are "110", and for outputting the added result H when the lower three bits are "111".

Next the operation of the over-run number calculating circuit arranged as mentioned above will be explained. The lower four bits of the prescribed value of the number of failures and the lower four bits of the number of counts are inputted to the adder 22 from the prescribed value storing register 20 and the failure counter 21 respectively and are summed. As shown in FIGS. 8–11, the cases of the lower four bits of the prescribed value of the number of failures are "0000", "0001", "0010", "0011", "0100", "0101", "0110", "0111", "1000", "1001", "1010", "1011", "1100", "1101", "1110", "1111", and the cases of the lower four bits of the counter 21 in each cycle are "0000", "0001", "0010", "0011", "0101", "0101", "0110", "0111", "1000", "1001", "1010", "1011", "1100", "1101", "1110", "1111". Therefore, the added result A of these numbers is obtained as shown in FIGS. 8–11. In addition, the result H which is the sum of the added result A and 2, the result G which is the sum of the added result A and 4, the result F which is the sum of the added result A and 6, the result E which is the sum of the added result A and 8, the result D which is the sum of the added result A and A, the result C which is the sum of the added result A and C, and the result B which is the sum of the added result A and E are obtained as shown in FIGS. 8–11. As mentioned above, the multiplexer 24 outputs the added result A when the lower three bits of the prescribed value of the number of failures are "000", outputs the added result B when the lower three bits are "001", outputs the added result C when the lower three bits are "010", outputs the added result D when the lower three bits are "011", outputs the added result E when the lower three bits are "100", outputs the added result F when the lower three bits are "110", outputs the added result G when the lower three bits are "110", and outputs the added result H when the lower three bits are "111". Therefore, as shown in the column of the number of over-runs in FIGS. 8–11, the number of data which over-run the prescribed value of the number of failures and are stored in the failure analysis memory (the number of over-runs) is outputted from the multiplexer 24.

As apparent in the above description, according to the present invention, the only stored data of the data cycles in which failures have occurred and which are indicated by failure mark signals can be read out in the sequence of the occurrences from the data of n data cycles stored at the same time in the n respective failure analysis memories 5. Therefore, the only data cycles having failure data which are stored can be read out from the n respective failure analysis memories 5.

In addition, according to the present invention, since an over-run number calculating circuit having a simple circuit arrangement is provided, the number of over-run data cycles which over-run the prescribed value of the number of failures and are stored in the failure analysis memory (the number of over-runs) can be obtained. Thus, the valid data can be read out by removing the number of the obtained over-run data cycles from the stored failure data read out in the sequence of the failure occurrences.

In such a way, by applying the present invention, the memory contents of the failure analysis memory in which semiconductor memory test results are stored, i.e., failure history, can smoothly be read out.

What is claimed is:

1. A method of testing a semiconductor memory comprising the steps of:

writing test data signals generated from a plurality of test pattern generators in a memory under test through a first interleave circuit by means of a first interleave operation;

reading out test result data from said memory under test through a second interleave circuit by means of a second interleave operation and distributing them to a plurality of logical comparators;

comparing the test result data with expected value data supplied from said test pattern generators in said logical comparators, respectively; and distributing, when the comparison result is failure, data in that interleave cycle containing the failure data to a plurality of failure analysis memories to store the data therein, said method further comprising the steps of:

generating failure data as well as a failure mark signal for indicating occurrence of failure from each of said plurality of logical comparators;

storing said failure mark signal in said plurality of failure analysis memories in correspondence to the failure data; and sequentially reading out the failure mark signals from said failure analysis memories after the testing of the memory under test is completed to identify a data cycle in which a failure has occurred.

2. The method according to claim 1 wherein said first and second interleave operations are a four-way interleave operation, an eight-way interleave operation or a sixteen-way interleave operation.

3. A semiconductor memory testing apparatus for carrying out the method recited in claim 1 wherein test data signals generated from a plurality of test pattern generators are written in a memory under test through a first interleave circuit by means of a first interleave operation, the test result data are read out from said memory under test through a second interleave circuit by means of a second interleave operation and are distributed to a plurality of logical comparators, the test result data are compared with expected value data supplied from said test pattern generators in said logical comparators, respectively, and when the comparison result is failure, data in that interleave cycle containing the failure data are distributed to and stored in a plurality of failure analysis memories, respectively, said semiconductor memory testing apparatus being characterized in that each of said logical comparators has a circuit for generating a failure mark signal indicating occurrence of a failure based on the failure data, and each of said plurality of failure analysis memories has a storage area for storing the failure mark signal generated from the corresponding logical comparator in correspondence to the failure data.

4. The apparatus according to claim 3 wherein said first and second interleave operations are a four-way interleave operation, an eight-way interleave operation or a sixteen-way interleave operation.

5. The apparatus according to claim 3 further comprising:

a failure counter for counting said failure mark signals and outputting a lower bit or bits of the count value;

a prescribed value storing register for storing a prescribed value of the number of failures and outputting a lower bit or bits of the prescribed value;

an adder for adding the lower bit output of said failure counter and the lower bit output of said prescribed value storing register;

a constant adding circuit for adding a constant to the added result of said adder and outputting a lower bit or bits of the added result of said constant adding circuit; and a multiplexer supplied with the lower bit output of said adder and the lower bit output of said constant adding circuit for selectively outputting one of the output of said adder and the output of said constant adding circuit depending on the lower bit or bits of said prescribed value storing register.

6. The apparatus according to claim 5 wherein said failure counter counts the failure mark signals and outputs lower two bits of the count value;

said prescribed value storing register outputs the least significant bit and lower two bits of said prescribed value of the number of failures;

said adder adds the lower two bit output of said failure counter and the lower two bit output of said prescribed value storing register, and outputs lower two bits of the added result;

said constant adding circuit adds 2 to the lower two bit output of said adder; and said multiplexer is supplied with the lower two bit output of said adder and the lower two bit output of said constant adding circuit, and selectively outputs one of the added result of said adder and the added result of said constant adding circuit depending on the least significant bit output of said prescribed value storing register.

7. The apparatus according to claim 5 wherein said failure counter counts the failure mark signals and outputs lower three bits of the count value;

said prescribed value storing register outputs lower two bits and lower three bits of said prescribed value of the number of failures;

said adder adds the lower three bit output of said failure counter and the lower three bit output of said prescribed value storing register, and outputs lower three bits of she added result;

said constant adding circuit comprises three circuits one of which is a circuit for adding 2 to the lower three bit output of said adder, another one of which is a circuit for adding 4 to the lower three bit output of said adder and the remaining one of which is a circuit for adding 6 to the lower three bit output of said adder; and said multiplexer is supplied with the lower three bit output of said adder and the lower three bit output of each of said three circuits of said constant adding circuit, and selectively outputs one of the added result of said adder and the added result of said constant adding circuit depending on the lower two bit output of said prescribed value storing register.

8. The apparatus according to claim 5 wherein said failure counter counts the failure mark signals and outputs lower four bits of the count value;

said prescribed value storing register outputs lower three bits and lower four bits of said prescribed value of the number of failures;

said adder adds the lower four bit output of said failure counter and the lower four bit output of said prescribed value storing register, and outputs lower four bits of the added result;

said constant adding circuit comprises seven circuits the first of which is a circuit for adding 2 to the lower four bit output of said adder, the second of which is a circuit for adding 4 to the lower four bit output of said adder, the third of which is a circuit for adding 6 to the lower four bit output of said adder, the fourth of which is a circuit for adding 8 to the lower four bit output of said adder, the fifth of which is a circuit for adding "A" to the lower four bit output of said adder, the sixth of which is a circuit for adding "C" to the lower four bit output of said adder, and the seventh of which is a circuit for adding "E" to the lower four bit output of said adder; and said multiplexer is supplied with the lower four bit output of said adder and the lower four bit output of each of said seven circuits of said constant adding circuit, and selectively outputs one of the added result of said adder and the added result of said constant adding circuit depending on the lower three bit output of said prescribed value storing register.

* * * * *